United States Patent
Iwasaki et al.

(10) Patent No.: US 11,660,644 B2
(45) Date of Patent: May 30, 2023

(54) SUBSTRATE PROCESSING METHOD AND SUBSTRATE PROCESSING DEVICE

(71) Applicant: SCREEN Holdings Co., Ltd., Kyoto (JP)

(72) Inventors: Akihisa Iwasaki, Kyoto (JP); Hiroaki Takahashi, Kyoto (JP)

(73) Assignee: SCREEN Holdings Co., Ltd.

( * ) Notice: Subject to any disclaimer, the term of this patent is extended or adjusted under 35 U.S.C. 154(b) by 635 days.

(21) Appl. No.: 16/606,473

(22) PCT Filed: Apr. 10, 2018

(86) PCT No.: PCT/JP2018/015123
§ 371 (c)(1),
(2) Date: Oct. 18, 2019

(87) PCT Pub. No.: WO2018/193920
PCT Pub. Date: Oct. 25, 2018

(65) Prior Publication Data
US 2021/0276052 A1    Sep. 9, 2021

(30) Foreign Application Priority Data
Apr. 19, 2017    (JP) .............................. JP2017-083173

(51) Int. Cl.
*B08B 3/08* (2006.01)
*H01L 21/02* (2006.01)

(52) U.S. Cl.
CPC .......... *B08B 3/08* (2013.01); *H01L 21/02057* (2013.01); *B08B 2203/002* (2013.01); *H01L 21/02052* (2013.01)

(58) Field of Classification Search
None
See application file for complete search history.

(56) References Cited

U.S. PATENT DOCUMENTS

2002/0102852 A1 * 8/2002 Verhaverbeke .......... C11D 3/32
257/E21.228
2002/0189639 A1    12/2002 Aoki et al. ........................ 134/2
(Continued)

FOREIGN PATENT DOCUMENTS

CN    101150047 A    3/2008
CN    102420112 A    4/2012
(Continued)

OTHER PUBLICATIONS

International Preliminary Report on Patentability (Chapter I) dated Oct. 31, 2019 with a Notification from the International Bureau (Form PCT/IB/326) in corresponding PCT International Application No. PCT/JP2018/015123 in Japanese.
(Continued)

*Primary Examiner* — Mikhail Kornakov
*Assistant Examiner* — Ryan L Coleman
(74) *Attorney, Agent, or Firm* — Ostrolenk Faber LLP

(57) ABSTRACT

A substrate processing method includes a substrate holding step of holding a substrate having a front surface on which a metal is exposed, an inert gas replacing step of replacing an atmosphere around the front surface of the substrate with an inert gas by supplying an inert gas to a vicinity of the front surface of the substrate, an adjusting step of adjusting a pH of the rinsing liquid so as to form an inactive state in which the metal does not react with the rinsing liquid or so as to form a passive state by allowing the metal to react with the rinsing liquid, and a rinsing liquid supplying step of supplying the rinsing liquid whose pH has been adjusted to the front surface of the substrate after the atmosphere around the front surface of the substrate has been replaced with the inert gas.

10 Claims, 19 Drawing Sheets

(56) References Cited

U.S. PATENT DOCUMENTS

| | | | |
|---|---|---|---|
| 2005/0006348 A1* | 1/2005 | Miya | C03C 23/0075 |
| | | | 257/E21.228 |
| 2005/0252526 A1 | 11/2005 | Ogawa et al. | 134/2 |
| 2008/0041420 A1 | 2/2008 | Sekiguchi et al. | 134/18 |
| 2008/0066783 A1 | 3/2008 | Tanaka | 134/21 |
| 2012/0074101 A1 | 3/2012 | Nakamura | 216/83 |
| 2014/0299163 A1 | 10/2014 | Ishibashi | 134/33 |
| 2016/0064257 A1 | 3/2016 | Nonaka et al. | |
| 2017/0207079 A1* | 7/2017 | Lee | B08B 3/10 |

FOREIGN PATENT DOCUMENTS

| | | |
|---|---|---|
| JP | H11-221532 A | 8/1999 |
| JP | 2002-373879 A | 12/2002 |
| JP | 2003-109936 A | 4/2003 |
| JP | 2004-273799 A | 9/2004 |
| JP | 2005-251806 A | 9/2005 |
| JP | 2005-327807 A | 11/2005 |
| JP | 2007-201111 A | 8/2007 |
| JP | 2009-054635 A | 3/2009 |
| JP | 2009-200524 A | 9/2009 |
| JP | 2010-056218 A | 3/2010 |
| JP | 2013-105916 A | 5/2013 |
| JP | 2014-203906 A | 10/2014 |
| JP | 2016-048778 A | 4/2016 |
| WO | WO2007/030476 * | 3/2007 |

OTHER PUBLICATIONS

English translation of the International Preliminary Report on Patentability (Chapter I) dated Oct. 31, 2019 with a Notification from the International Bureau (Form PCT/IB/338) in corresponding PCT International Application No. PCT/JP2018/015123.

International Search Report dated Jun. 19, 2018 in corresponding PCT International Application No. PCT/JP2018/015123.

Written Opinion dated Jun. 19, 2018 in corresponding PCT International Application No. PCT/JP2018/015123.

* cited by examiner

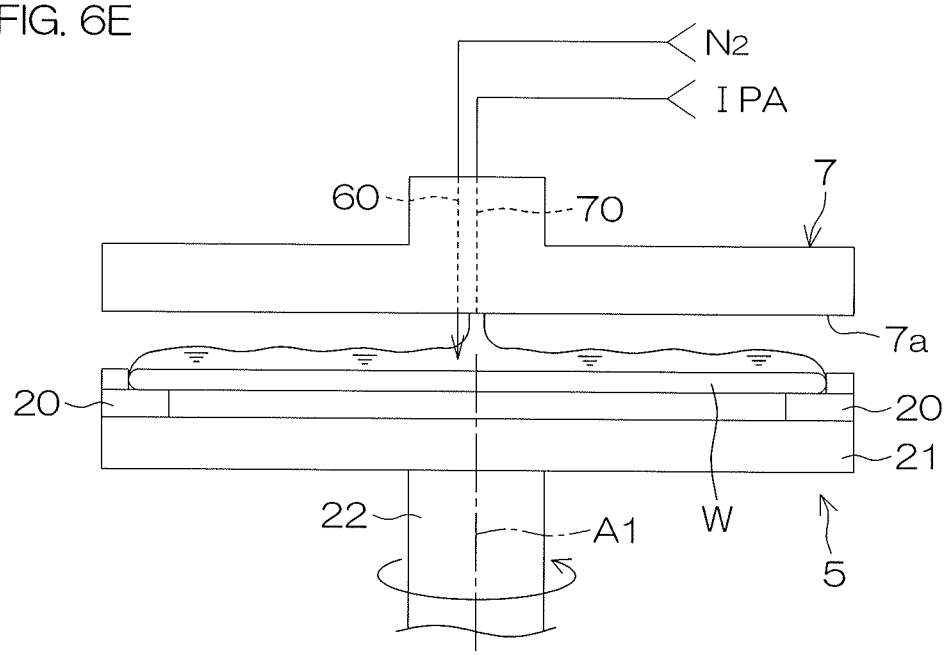

pH=5, ORP=0.7V, Carbonated water rinsing pH=7, ORP=0.5V, DIW rinsing pH=9, ORP=0.2V, Ammonia water rinsing Non-execution of N2 replacement, Ammonia water rinsing

| Substrate rotational frequency (rpm) | Electric conductivity ($\mu$S/cm) | Ammonia concentration (ppm) |
|---|---|---|
| 1000 | 18.5 | 5 |
| 500 | 10 | 1.5 |
| 200 | 5.85 | 0.5 |
| 10 | 1 | 0.015 |

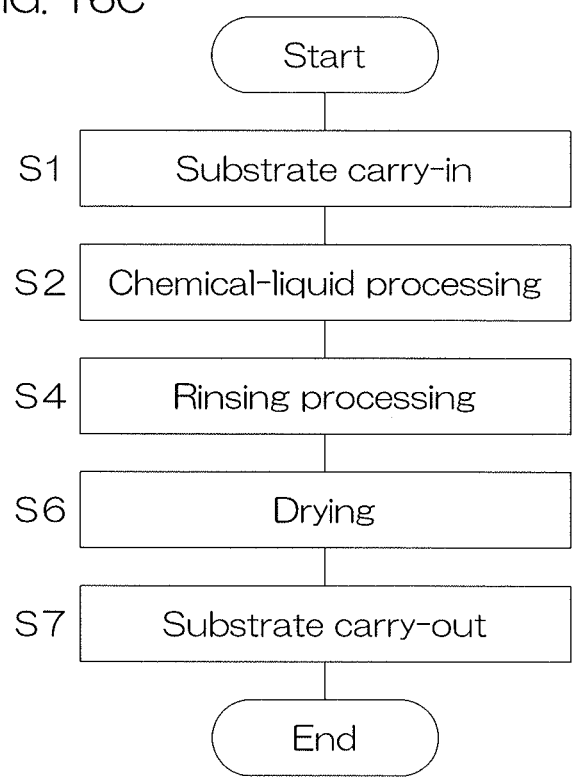

SUBSTRATE PROCESSING METHOD AND SUBSTRATE PROCESSING DEVICE

CROSS-REFERENCE TO RELATED APPLICATIONS

The present application is a 35 U.S.C. §§ 371 national phase conversion of PCT/JP2018/015123, filed Apr. 10, 2018, which claims priority to Japanese Patent Application No. 2017-083173, filed Apr. 19, 2017, the contents of both of which are incorporated herein by reference. The PCT International Application was published in the Japanese language.

TECHNICAL FIELD

The present invention relates to a substrate processing method and a substrate processing apparatus for processing a substrate. Examples of substrates to be processed include semiconductor wafers, substrates for liquid crystal displays, substrates for FPDs (Flat Panel Displays) such as organic EL (Electroluminescence) displays, substrates for optical disks, etc., substrates for magnetic disks, substrates for magneto-optical disks, substrates for photomasks, ceramic substrates, substrates for solar cells, etc.

BACKGROUND ART

In substrate processing performed by a single substrate processing type substrate processing apparatus that processes substrates one by one, for example, a chemical liquid is supplied to the substrate that is held substantially horizontally by means of a spin chuck. Thereafter, a rinsing liquid is supplied to the substrate, and hence the chemical liquid on the substrate is replaced with the rinsing liquid. Thereafter, a spin drying step is performed to remove the rinsing liquid existing on the substrate.

When a rinsing liquid is supplied to a front surface, on which a metal wiring (for example, copper wiring) is exposed, of a substrate, the metal wiring on the substrate is oxidized by oxygen (dissolved oxygen) that has been dissolved in the rinsing liquid. A metal forming the metal wiring becomes oxide ions of the metal by being oxidized, and is dissolved in the rinsing liquid. In other words, there is a concern that the quality of a device produced from the substrate will be reduced because the metal wiring is corroded (is subjected to etching). The amount of etching of the metal wiring becomes larger in proportion to an increase in concentration of oxygen existing in the rinsing liquid.

CITATION LIST

Patent Literature

Patent Literature 1: Japanese Patent Application Publication No. 2010-56218

SUMMARY OF INVENTION

Technical Problem

Therefore, a method for reducing oxygen dissolved in a processing liquid by degassing a rinsing liquid has been proposed in Patent Literature 1. Although this makes it possible to reduce the oxygen dissolved in the rinsing liquid, the dissolved oxygen has been expected to be further reduced. Additionally, there is a concern that the metal exposed from the front surface of the substrate will also be corroded by constituents (for example, hydrogen ions) existing in the rinsing liquid other than the dissolved oxygen, and yet, in the method of Patent Literature 1, a particular countermeasure is not taken against metal corrosion that is caused by the constituents existing in the rinsing liquid other than the dissolved oxygen.

Therefore, an object of the present invention is to provide a substrate processing method and a substrate processing apparatus that are capable of restraining metal corrosion in a configuration to process a substrate having a front surface on which a metal is exposed.

Solution to Problem

One preferred embodiment of the present invention provides a substrate processing method that includes a substrate holding step of holding a substrate having a front surface on which a metal is exposed, an inert gas replacing step of replacing an atmosphere around the front surface of the substrate with an inert gas by supplying an inert gas to a vicinity of the front surface of the substrate, an adjusting step of adjusting a pH of a rinsing liquid so as to form an inactive state in which the metal does not react with the rinsing liquid or so as to form a passive state by allowing the metal to react with the rinsing liquid, and a rinsing liquid supplying step of supplying the rinsing liquid whose pH has been adjusted to the front surface of the substrate after the atmosphere around the front surface of the substrate has been replaced with the inert gas.

According to this method, when a rinsing liquid is supplied to the front surface of the substrate, an atmosphere around the front surface of the substrate is replaced with an inert gas. Therefore, the oxygen concentration of the atmosphere around the front surface of the substrate is in a reduced state. Therefore, it is possible to restrain an increase in concentration of dissolved oxygen in the rinsing liquid, which is caused by the fact that oxygen is newly dissolved in the rinsing liquid on the front surface of the substrate. Additionally, the amount of oxygen that has been dissolved in the rinsing liquid is further reduced by allowing oxygen to move to the atmosphere around the front surface of the substrate from the rinsing liquid so as to maintain a solution equilibrium state. Therefore, metal corrosion caused by dissolved oxygen is reduced. Preferably, the inert gas is supplied to the vicinity of the front surface of the substrate such that the oxygen concentration of an atmosphere around the upper surface of the substrate becomes 250 ppm or less.

Additionally, the pH of a rinsing liquid supplied to the front surface of the substrate is adjusted so as to form an inactive state in which a metal exposed from the front surface of the substrate does not react with the rinsing liquid or so as to form a passive state by allowing the metal to react with the rinsing liquid. Therefore, metal corrosion that is caused by constituents existing in the rinsing liquid or by oxygen dissolved in the rinsing liquid is further reduced.

As a result, in a configuration to process a substrate having a front surface on which a metal is exposed, it is possible to restrain the corrosion of this metal.

Here, the pH of the rinsing liquid may be adjusted by mixing a pH adjustment fluid with the rinsing liquid. Additionally, if the pH of the rinsing liquid has been reached a desired value without mixing the pH adjustment fluid, the pH adjustment fluid is not required to be mixed with the rinsing liquid.

In one preferred embodiment of the present invention, the substrate processing method further includes an organic solvent replacing step of replacing the rinsing liquid on the front surface of the substrate with an organic solvent that is miscible with the rinsing liquid by supplying the organic solvent to the front surface of the substrate.

Here, there is a case in which, in the rinsing liquid adhering to the front surface of the substrate, ions of a metal that has been slightly eluted from the front surface of the substrate into the rinsing liquid and constituents contained in the rinsing liquid create complex ions. Therefore, there is a concern that particles, such as salt that derives from the complex ions, etc., will be generated on the front surface of the substrate. Therefore, there is a need to restrain the occurrence of particles by replacing the rinsing liquid on the upper surface of the substrate with a liquid differing from the rinsing liquid after completing the rinsing liquid supplying step.

If water is selected as a liquid with which the rinsing liquid is replaced, constituents that create complex ions with metal ions are excluded from the front surface of the substrate by allowing water to be supplied to the front surface of the substrate. Hence, metal ions and hydroxide ions contained in the water can easily form a metal hydroxide that is more easily precipitated than the salt of complex ions.

Therefore, if an organic solvent that is miscible with the rinsing liquid is selected as a liquid with which the rinsing liquid is replaced, it is possible to remove the complex ions, and it is possible to reduce the concentration of the hydroxide ions contained in the liquid adhering to the front surface of the substrate. Therefore, it is possible to restrain the formation of a metal hydroxide (precipitate) while restraining the occurrence of salt deriving from complex ions. Therefore, it is possible to restrain the occurrence of particles.

In one preferred embodiment of the present invention, the substrate processing method further includes a chemical liquid supplying step of supplying a chemical liquid that is capable of forming salt with the rinsing liquid to the front surface of the substrate, and a pre-rinsing liquid supplying step of washing away the chemical liquid adhering to the front surface of the substrate by supplying a pre-rinsing liquid to the front surface of the substrate, the pre-rinsing liquid supplying step being performed between the chemical liquid supplying step and the rinsing liquid supplying step. Hence, the chemical liquid is washed away by a pre-rinsing liquid before the rinsing liquid is supplied to the front surface of the substrate. Therefore, it is possible to prevent or restrain salt formation on the substrate by the chemical liquid and the rinsing liquid.

In one preferred embodiment of the present invention, the substrate processing method further includes a substrate rotating step of rotating the substrate around a rotational axis along a vertical direction in the pre-rinsing liquid supplying step. Additionally, the substrate is rotated at 1000 rpm or less in the substrate rotating step.

Here, when a pre-rinsing liquid lands on the front surface of the substrate, friction occurs between the pre-rinsing liquid and the upper surface of the substrate W in the pre-rinse supplying step. Because of this friction, the substrate is electrified with static electricity. The present inventors have focused attention on the fact that the electric charge amount of the upper surface of the substrate W is changed in accordance with a change in the rotational speed of the substrate. When the rotational speed becomes large, the electric charge amount becomes large, whereas when the rotational speed becomes small, the electric charge amount becomes small. There is a concern that, if the electric charge amount of the upper surface of the substrate increases, a defect will occur in a device produced from this substrate. If the rotational speed of the substrate is 1000 rpm or less, it is possible to sufficiently reduce the electric charge amount of the upper surface of the substrate.

In one preferred embodiment of the present invention, in the adjusting step, the pH of the rinsing liquid and an oxidation-reduction potential of the rinsing liquid are adjusted so as to form an inactive state in which the metal does not react with the rinsing liquid or so as to form a passive state by allowing the metal to react with the rinsing liquid. In the rinsing liquid supplying step, the rinsing liquid whose pH and whose oxidation-reduction potential have been adjusted is supplied to the front surface of the substrate.

Here, the metal corrosion also depends on the oxidation-reduction potential of the rinsing liquid. The rinsing liquid supplied to the front surface of the substrate is adjusted not only in its pH but also in its oxidation-reduction potential. Therefore, it is possible to more effectively restrain the metal corrosion. Particularly, the oxidation-reduction potential of the rinsing liquid is adjusted to become, preferably, $-0.5$ V or more and 1.0 V or less, and the pH of the rinsing liquid is adjusted to become, preferably, 7 or more and 10 or less. If this range is satisfied, the pH and the oxidation-reduction potential are easily adjusted such that a metal exposed from the front surface of the substrate creates an inactive state or a passive state.

Here, the oxidation-reduction potential of the rinsing liquid may be adjusted by mixing an oxidation-reduction potential adjustment fluid with the rinsing liquid. Additionally, if the oxidation-reduction potential of the rinsing liquid has been reached a desired value without mixing the oxidation-reduction potential adjustment fluid, the oxidation-reduction potential adjustment fluid is not required to be mixed with the rinsing liquid.

In one preferred embodiment of the present invention, the substrate processing method further includes a degassing step of degassing the rinsing liquid prior to the adjusting step. Hence, the pH, etc. (pH and oxidation-reduction potential) of the rinsing liquid are adjusted after the rinsing liquid is degassed.

Here, there is a case in which, for example, a gas is used to adjust the pH, etc., of the rinsing liquid (as a pH adjustment fluid or as an oxidation-reduction potential adjustment fluid). In this case, it is possible to remove oxygen from the rinsing liquid while preventing the gas used to adjust the pH, etc., from being removed from the rinsing liquid. In other words, it is possible to reliably adjust the pH, etc., of the rinsing liquid while reducing the dissolved oxygen concentration of the rinsing liquid.

In one preferred embodiment of the present invention, the substrate is horizontally held in the substrate holding step, and an inert gas is supplied to a vicinity of the upper surface of the substrate in the inert gas replacing step. The substrate processing method further includes a proximity step of moving a facing member that faces the substrate from above such that a facing surface of the facing member is placed at a proximal position close to the upper surface of the substrate during the inert gas replacing step and the rinsing liquid supplying step. Therefore, it is possible to isolate a space between the facing surface of the facing member and the upper surface of the substrate from an external space. Therefore, it is possible to reliably perform the replacement of an atmosphere around the upper surface of the substrate with an inert gas in a short time.

One preferred embodiment of the present invention provides a substrate processing apparatus that includes a substrate holding unit that holds a substrate having a front surface on which a metal is exposed, an inert gas supply unit that supplies an inert gas toward the front surface of the substrate, a rinsing liquid supply unit that supplies a rinsing liquid to the front surface of the substrate, an adjusting unit that adjusts a pH of the rinsing liquid, and a controller that controls the inert gas supply unit, the rinsing liquid supply unit, and the adjusting unit.

The controller is programmed to perform an inert gas replacing step of replacing an atmosphere around the front surface of the substrate with an inert gas by supplying an inert gas to a vicinity of the front surface of the substrate from the inert gas supply unit, an adjusting step of allowing the adjusting unit to adjust a pH of the rinsing liquid so as to form an inactive state in which the metal does not react with the rinsing liquid or so as to form a passive state by allowing the metal to react with the rinsing liquid, and a rinsing liquid supplying step of supplying the rinsing liquid whose pH has been adjusted to the front surface of the substrate from the rinsing liquid supply unit after the atmosphere around the front surface of the substrate has been replaced with an inert gas.

According to this configuration, when a rinsing liquid is supplied to the front surface of the substrate, an atmosphere around the front surface of the substrate is replaced with an inert gas. Therefore, the oxygen concentration of the atmosphere around the front surface of the substrate is in a reduced state. Therefore, it is possible to restrain an increase in concentration of dissolved oxygen in the rinsing liquid, which is caused by the fact that oxygen is newly dissolved in the rinsing liquid existing on the front surface of the substrate. Additionally, the amount of oxygen that has been dissolved in the rinsing liquid is further reduced by allowing oxygen to move to the atmosphere around the front surface of the substrate from the rinsing liquid so as to maintain a solution equilibrium state. Therefore, metal corrosion caused by dissolved oxygen is reduced. Preferably, an inert gas is supplied to the vicinity of the front surface of the substrate such that the oxygen concentration of the atmosphere around the front surface of the substrate becomes 250 ppm or less.

Additionally, the pH of a rinsing liquid supplied to the front surface of the substrate is adjusted such that a metal exposed from the front surface of the substrate does not react with the rinsing liquid or such that a passive state is formed when the metal reacts with the rinsing liquid. Therefore, metal corrosion that is caused by constituents in the rinsing liquid or by dissolved oxygen in the rinsing liquid is further reduced.

As a result, in a configuration to process a substrate having a front surface on which a metal is exposed, it is possible to restrain the corrosion of this metal.

Here, the pH of the rinsing liquid may be adjusted by mixing a pH adjustment fluid with the rinsing liquid. Additionally, if the pH of the rinsing liquid has been reached a desired value without mixing the pH adjustment fluid, the pH adjustment fluid is not required to be mixed with the rinsing liquid.

In one preferred embodiment of the present invention, the substrate processing apparatus further includes an organic solvent supply unit that supplies an organic solvent that is miscible with the rinsing liquid to the front surface of the substrate. Additionally, the controller is programmed to perform an organic solvent replacing step of replacing the rinsing liquid on the front surface of the substrate with the organic solvent by supplying the organic solvent to the front surface of the substrate from the organic solvent supply unit.

Here, there is a case in which, in the rinsing liquid on the front surface of the substrate, ions of a metal that has been slightly eluted from the front surface of the substrate into the rinsing liquid and constituents contained in the rinsing liquid create complex ions. Therefore, it is possible to remove the complex ions by replacing the rinsing liquid with an organic solvent that is miscible with the rinsing liquid, and it is possible to reduce the concentration of hydroxide ions contained in the liquid adhering to the front surface of the substrate. Therefore, it is possible to restrain the formation of a metal hydroxide (precipitate) while restraining the occurrence of salt deriving from complex ions. Therefore, it is possible to restrain the occurrence of particles.

In one preferred embodiment of the present invention, the substrate processing apparatus further includes a chemical liquid supply unit that supplies a chemical liquid that is capable of forming salt with the rinsing liquid to the front surface of the substrate, and a pre-rinsing liquid supply unit that supplies a pre-rinsing liquid to the front surface of the substrate. The controller is programmed to further perform a chemical liquid supplying step of supplying the chemical liquid to the front surface of the substrate from the chemical liquid supply unit, and a pre-rinsing liquid supplying step of washing away the chemical liquid adhering to the front surface of the substrate by supplying a pre-rinsing liquid to the front surface of the substrate from the pre-rinsing liquid supply unit after completing the chemical liquid supplying step and before starting the rinsing liquid supplying step. Hence, the chemical liquid is washed away by a pre-rinsing liquid before the rinsing liquid is supplied to the front surface of the substrate. Therefore, it is possible to prevent or restrain salt formation on the substrate by the chemical liquid and the rinsing liquid.

In one preferred embodiment of the present invention, the substrate processing apparatus further includes a substrate rotating unit that rotates the substrate around a rotational axis along a vertical direction. Additionally, the controller performs a substrate rotating step of rotating the substrate at 1000 rpm or less while controlling the substrate rotating unit. The rotational speed of the substrate is 1000 rpm or less, and therefore it is possible to sufficiently reduce the electric charge amount of the upper surface of the substrate.

In one preferred embodiment of the present invention, the adjusting unit is configured to adjust an oxidation-reduction potential of the rinsing liquid. The controller performs a step of allowing the adjusting unit to adjust the pH of the rinsing liquid and the oxidation-reduction potential of the rinsing liquid so as to form an inactive state in which the metal does not react with the rinsing liquid or so as to form a passive state by allowing the metal to react with the rinsing liquid in the adjusting step.

According to this configuration, the rinsing liquid supplied to the front surface of the substrate is adjusted not only in its pH but also in its oxidation-reduction potential. Therefore, it is possible to more effectively restrain the metal corrosion. Particularly, the oxidation-reduction potential of the rinsing liquid is adjusted to become, preferably, −0.5 V or more and 1.0 V or less, and the pH of the rinsing liquid is adjusted to become, preferably, 7 or more and 10 or less. If this range is satisfied, the pH and the oxidation-reduction potential are easily adjusted such that a metal exposed from the front surface of the substrate W creates an inactive state or a passive state.

Here, the oxidation-reduction potential of the rinsing liquid may be adjusted by mixing an oxidation-reduction potential adjustment fluid with the rinsing liquid. Additionally, if the oxidation-reduction potential of the rinsing liquid has been reached a desired value without mixing the oxidation-reduction potential adjustment fluid, the oxidation-reduction potential adjustment fluid is not required to be mixed with the rinsing liquid.

The substrate processing apparatus further includes a degassing unit that degases the rinsing liquid. The controller further performs a degassing step of allowing the degassing unit to degas the rinsing liquid prior to the pH adjusting step.

Hence, the pH, etc., of the rinsing liquid are adjusted after the rinsing liquid is degassed. Here, there is a case in which, for example, a gas is used to adjust the pH, etc., of the rinsing liquid (as a pH adjustment fluid or as an oxidation-reduction potential adjustment fluid). In this case, it is possible to remove oxygen from the rinsing liquid while preventing the gas used to adjust the pH, etc., from being removed from the rinsing liquid. In other words, it is possible to reliably adjust the pH of the rinsing liquid while reducing the dissolved oxygen concentration of the rinsing liquid.

The substrate holding unit horizontally holds the substrate, and the inert gas supply unit supplies an inert gas toward the upper surface of the substrate. The substrate processing apparatus further includes a facing member that has a facing surface facing the substrate from above and that is movable up and down. The controller further performs a proximity step of bringing the facing member closer to the substrate such that the facing surface is placed at a proximal position close to the upper surface of the substrate during the inert gas replacing step and the rinsing liquid supplying step. Therefore, it is possible to isolate a space between the facing surface of the facing member and the upper surface of the substrate from an external space. Therefore, it is possible to reliably perform the replacement of an atmosphere around the upper surface of the substrate with an inert gas in a short time.

The above and other elements, features, steps, characteristics and advantages of the present invention will become more apparent from the following detailed description of the preferred embodiments with reference to the attached drawings.

BRIEF DESCRIPTION OF DRAWINGS

FIG. 6E is an illustrative cross-sectional view to describe the substrate processing.

FIG. 16C is a flowchart to describe another example of substrate processing performed by the substrate processing apparatus.

DESCRIPTION OF EMBODIMENTS

Figure 1:
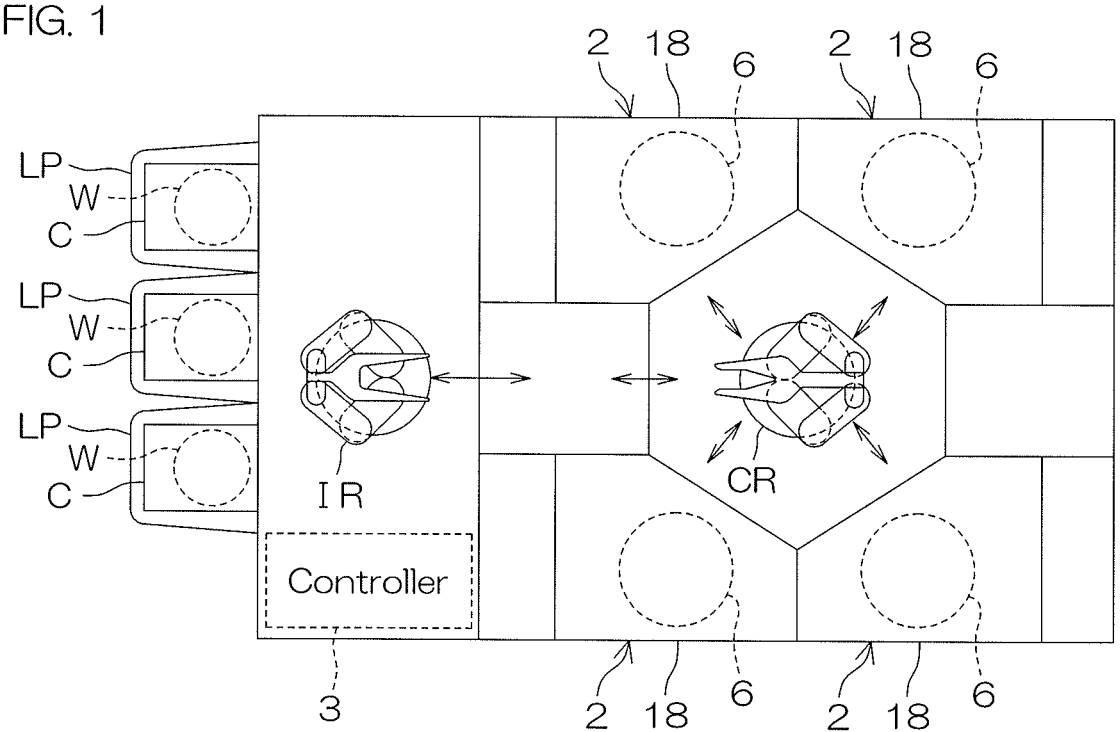
FIG. 1 is a schematic plan view to describe the layout of the inside of a substrate processing apparatus according to a preferred embodiment of the present invention.

FIG. 1 is an illustrative plan view to describe the layout of the inside of a substrate processing apparatus 1 according to a preferred embodiment of the present invention.

The substrate processing apparatus 1 is a single substrate processing type apparatus that processes substrates W, such as silicon wafers, etc., one by one. In the present preferred embodiment, the substrate W is a disk-shaped substrate. The substrate W has a front surface on which a film of a metal, such as copper (Cu), cobalt (Co), nickel (Ni), or manganese (Mn), etc., is exposed. The substrate processing apparatus 1 includes a plurality of processing units 2 each of which processes a substrate W by use of a processing liquid, such as a chemical liquid or a rinsing liquid, etc., load ports LP in which are placed carriers C that house a plurality of substrates W to be processed by the processing unit 2, transfer robots IR and CR each of which transfers a substrate W between the load port LP and the processing unit 2, and a controller 3 that controls the substrate processing apparatus 1. The transfer robot IR transfers a substrate W between the carrier C and the transfer robot CR. The transfer robot CR transfers a substrate W between the transfer robot IR and the processing unit 2. The plurality of processing units 2 have, for example, the same configuration.

Figure 2:
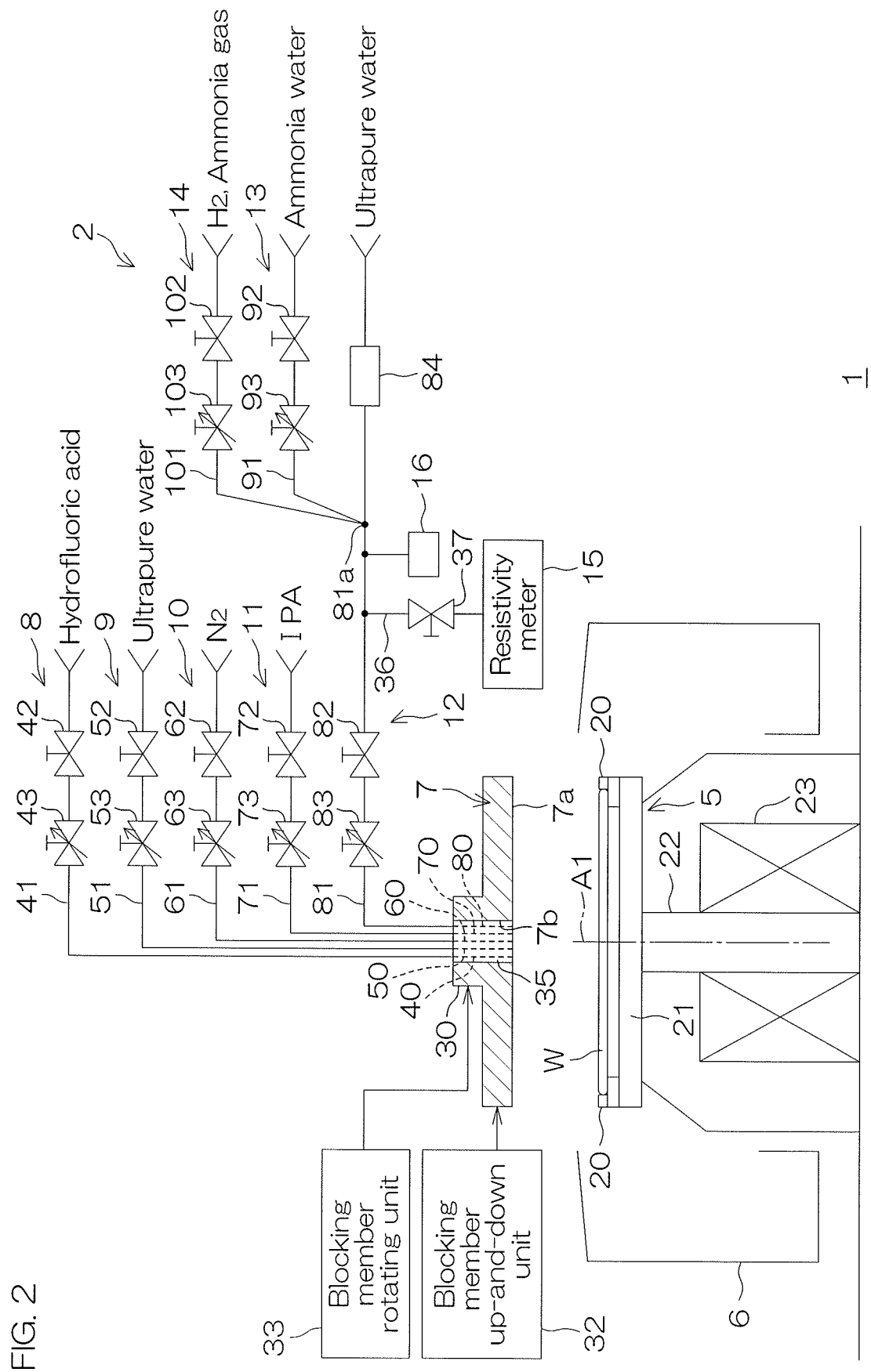
FIG. 2 is a schematic view of a processing unit provided in the substrate processing apparatus.

FIG. 2 is a schematic view to describe an configuration example of the processing unit 2.

The processing unit 2 includes a spin chuck 5, a cylindrical cup 6, and a blocking plate 7 (a facing member) that is movable up and down. The spin chuck 5 rotates a single substrate W around a vertical rotational axis A1 passing through a center portion of the substrate W while holding the substrate W in a horizontal posture. The cup 6 surrounds the spin chuck 5. The blocking plate 7 has a facing surface 7a that faces an upper surface of the substrate W with an interval between the facing surface 7a and the upper surface thereof. The substrate W is held by the spin chuck 5 such that the front surface of the substrate W on which a metal is exposed becomes the upper surface of the substrate W.

The processing unit 2 further includes a chemical liquid supply unit 8 that supplies a chemical liquid to the upper surface (front surface) of the substrate W, a pre-rinsing liquid supply unit 9 that supplies a pre-rinsing liquid, such as ultrapure water, etc., to the upper surface of the substrate W, an inert gas supply unit 10 that supplies a gas, such as nitrogen gas ($N_2$), etc., toward the upper surface of the substrate W, an organic solvent supply unit 11 that supplies an organic solvent, such as isopropyl alcohol (IPA), etc., to the upper surface of the substrate W, a rinsing liquid supply unit 12 that supplies a rinsing liquid to the upper surface of the substrate W, and an adjusting unit 13 that adjusts the pH and oxidation-reduction potential (also referred to as ORP) of a rinsing liquid. The rinsing liquid denotes deionized water (DIW) or ultrapure water with which the upper surface of the substrate W is rinsed. It is more preferable to use ultrapure water as the rinsing liquid than to use DIW. The pre-rinsing liquid is a liquid that is used to beforehand rinse the upper surface of the substrate W before the upper surface of the substrate W is rinsed with the rinsing liquid.

The processing unit 2 further includes a chamber 18 (see FIG. 1) in which the cup 6 is housed. The chamber 18 has an entrance-exit opening (not shown) through which a substrate W is carried into the inside of the chamber 18 or through which a substrate W is carried out from the inside of the chamber 18. The chamber 18 is provided with a shutter unit (not shown) that opens and closes the entrance-exit opening.

The spin chuck 5 includes chuck pins 20, a spin base 21, a rotational shaft 22 joined to a center of a lower surface of the spin base 21, and an electric motor 23 that gives a rotational force to the rotational shaft 22. The rotational shaft 22 extends in a vertical direction along the rotational axis A1. The spin base 21 is joined to an upper end of the rotational shaft 22.

The spin base 21 has a disk shape along a horizontal direction. The plurality of chuck pins 20 are disposed with intervals between the chuck pins 20 in a circumferential direction at a peripheral edge portion of an upper surface of the spin base 21. The spin base 21 and the chuck pins 20 are included in a substrate holding unit that horizontally holds a substrate W. The substrate holding unit is also referred to as a substrate holder.

The rotational shaft 22 is rotated by the electric motor 23, and, as a result, a substrate W is rotated around the rotational axis A1. The electric motor 23 is included in a substrate rotating unit that rotates a substrate W around the rotational axis A1.

The blocking plate 7 is formed in a disk shape having a diameter that is substantially equal to or larger than that of a substrate W, and is substantially horizontally disposed above the spin chuck 5. The blocking plate 7 is movable to an arbitrary position (height) from a lower position to an upper position. When the blocking plate 7 is in a proximal position, a space between the facing surface 7a of the blocking plate 7 and the upper surface of the substrate W is isolated from a circumambient atmosphere (atmosphere outside a space between the blocking plate 7 and the substrate W) by means of the blocking plate 7. The proximal position is a position (position of the blocking plate 7 in FIG. 6A to FIG. 6E described later) at which the blocking plate 7 is sufficiently close to the front surface of the substrate W.

A hollow shaft 30 is fixed to a surface opposite to the facing surface 7a in the blocking plate 7. A continuous hole 7b is formed in a part of the blocking plate 7 that includes a position that overlaps the rotational axis A1 in the blocking plate 7 in a plan view. The continuous hole 7b passes through the blocking plate 7 upwardly and downwardly, and leads to an internal space of the hollow shaft 30.

The processing unit 2 additionally includes a blocking plate up-and-down unit 32 that drives an up-and-down movement (raising and lowering) of the blocking plate 7 and a blocking plate rotating unit 33 that rotates the blocking plate 7 around the rotational axis A1. The blocking plate up-and-down unit 32 includes a ball screw mechanism (not shown) and an electric motor (not shown) that gives a driving force to the ball screw mechanism. The blocking plate rotating unit 33 includes an electric motor (not shown) that gives a driving force in a rotation direction around the rotational axis A1 to the blocking plate 7. The blocking plate rotating unit 33 is configured to give a driving force transmitted from the electric motor to the blocking plate 7 through the hollow shaft 30.

The chemical liquid supply unit 8 includes a chemical liquid nozzle 40, a chemical liquid supply pipe 41, a chemical liquid valve 42, and a chemical liquid flow-rate adjusting valve 43. The chemical liquid nozzle 40 supplies a chemical liquid to a central area of the upper surface of the substrate W. The chemical liquid supply pipe 41 is joined to the chemical liquid nozzle 40. The chemical liquid valve 42 and the chemical liquid flow-rate adjusting valve 43 are interposed in the chemical liquid supply pipe 41. A chemical liquid, such as hydrofluoric acid, etc., is supplied from a chemical liquid supply source to the chemical liquid supply pipe 41. The chemical liquid valve 42 opens and closes a flow passage of the chemical liquid. The chemical liquid flow-rate adjusting valve 43 adjusts the flow rate of the chemical liquid supplied to the chemical liquid nozzle 40 in accordance with its opening degree. The central area of the upper surface of the substrate W is an area including a rotational center of the upper surface of the substrate W.

The chemical liquid may be a liquid including at least one of sulfuric acid, acetic acid, nitric acid, hydrochloric acid, hydrofluoric acid, ammonia water, hydrogen peroxide water, organic acid (for example, citric acid, oxalic acid or the like), organic alkali (for example, tetramethylammonium hydroxide (TMAH) or the like), surfactant, and corrosion inhibitor without being limited to hydrofluoric acid. SPM (sulfuric acid/hydrogen peroxide mixture), SC1 (ammonia-hydrogen peroxide mixture), or the like can be mentioned as an example of a chemical liquid obtained by mixing the aforementioned substances together.

The pre-rinsing liquid supply unit 9 includes a pre-rinsing liquid nozzle 50, a pre-rinsing liquid supply pipe 51, a pre-rinsing liquid valve 52, and a pre-rinsing liquid flow-rate adjusting valve 53. The pre-rinsing liquid nozzle 50 supplies a pre-rinsing liquid to the central area of the upper surface of the substrate W. The pre-rinsing liquid supply pipe 51 is joined to the pre-rinsing liquid nozzle 50. The pre-rinsing liquid valve 52 and the pre-rinsing liquid flow-rate adjusting valve 53 are interposed in the pre-rinsing liquid supply pipe 51. The pre-rinsing liquid, such as ultrapure water, etc., is supplied from a pre-rinsing liquid supply source to the pre-rinsing liquid supply pipe 51. The pre-rinsing liquid valve 52 opens and closes a flow passage of the pre-rinsing liquid. The pre-rinsing liquid flow-rate adjusting valve 53 adjusts the flow rate of the pre-rinsing liquid supplied to the pre-rinsing liquid nozzle 50 in accordance with its opening degree. The pre-rinsing liquid may be, for example, DIW without being limited to ultrapure water.

The inert gas supply unit 10 includes an inert gas nozzle 60, an inert gas supply pipe 61, an inert gas valve 62, and an inert gas flow-rate adjusting valve 63. The inert gas nozzle 60 supplies an inert gas to the vicinity of the upper surface of the substrate W. The inert gas supply pipe 61 is joined to the inert gas nozzle 60. The inert gas valve 62 and the inert gas flow-rate adjusting valve 63 are interposed in the inert gas supply pipe 61. An inert gas, such as nitrogen gas, etc., is supplied from an inert gas supply source to the inert gas supply pipe 61. The inert gas valve 62 opens and closes a flow passage of the inert gas. The inert gas flow-rate adjusting valve 63 adjusts the flow rate of the inert gas supplied to the inert gas nozzle 60 in accordance with its opening degree.

The inert gas denotes a gas that is inert with respect to, for example, a metal exposed from the upper surface of the substrate W without being limited to a nitrogen gas. Rare gasses, such as helium and argon, etc., can be mentioned as examples of the inert gas, in addition to a nitrogen gas.

The organic solvent supply unit 11 includes an organic solvent nozzle 70, an organic solvent supply pipe 71, an organic solvent valve 72, and an organic solvent flow-rate adjusting valve 73. The organic solvent nozzle 70 supplies an organic solvent to the central area of the upper surface of the substrate W. The organic solvent supply pipe 71 is joined to the organic solvent nozzle 70. The organic solvent valve 72 and the organic solvent flow-rate adjusting valve 73 are interposed in the organic solvent supply pipe 71. An organic solvent, such as IPA, etc., is supplied from an organic solvent supply source to the organic solvent supply pipe 71. The organic solvent valve 72 opens and closes a flow passage of the organic solvent. The organic solvent flow-rate adjusting valve 73 adjusts the flow rate of the organic solvent supplied to the organic solvent nozzle 70 in accordance with its opening degree.

The organic solvent supplied from the organic solvent supply unit 11 is an organic solvent that is miscible with water that is a main component of the rinsing liquid. The organic solvent supplied from the organic solvent supply unit 11 is not limited to IPA, and may be a single organic solvent or a mixture of a plurality of organic solvents selected from a group consisting of IPA, isobutyl alcohol, isopentyl alcohol, ethyl ether, ethylene glycol monoethyl ether, propanol, 1-butanol, 2-buthanol, methanol, methyl isobutyl ketone, methyl ethyl ketone, etc.

The rinsing liquid supply unit 12 includes a rinsing liquid nozzle 80, a rinsing liquid supply pipe 81, a rinsing liquid valve 82, a rinsing liquid flow-rate adjusting valve 83, and a degassing unit 84. The rinsing liquid nozzle 80 supplies a rinsing liquid to the central area of the upper surface of the substrate W. The rinsing liquid supply pipe 81 is joined to the rinsing liquid nozzle 80. The degassing unit 84, the rinsing liquid valve 82, and the rinsing liquid flow-rate adjusting valve 83 are interposed in the rinsing liquid supply pipe 81 in this order from the upstream side. The rinsing liquid is supplied to the rinsing liquid supply pipe 81. The rinsing liquid valve 82 opens and closes a flow passage of the rinsing liquid. The rinsing liquid flow-rate adjusting valve 83 adjusts the flow rate of the rinsing liquid supplied to the rinsing liquid nozzle 80 in accordance with its opening degree. The degassing unit 84 degases the rinsing liquid.

The adjusting unit 13 includes a pH adjustment fluid supply pipe 91, a pH adjustment fluid valve 92, and a pH adjustment fluid flow-rate adjusting valve 93. The PH adjustment fluid supply pipe 91 is joined to the rinsing liquid supply pipe 81 upstream of the rinsing liquid valve 82 and downstream of the degassing unit 84. The pH adjustment fluid valve 92 and the pH adjustment fluid flow-rate adjusting valve 93 are interposed in the pH adjustment fluid supply pipe 91. A pH adjustment fluid is supplied from a pH adjustment fluid supply source to the pH adjustment fluid supply pipe 91. The PH adjustment fluid valve 92 opens and closes a flow passage of the pH adjustment fluid. The PH adjustment fluid flow-rate adjusting valve 93 adjusts the flow rate of the pH adjustment fluid supplied from the pH adjustment fluid supply pipe 91 to the rinsing liquid supply pipe 81 in accordance with its opening degree. The pH adjustment fluid is supplied to the rinsing liquid supply pipe 81, and, as a result, the rinsing liquid and the pH adjustment fluid are mixed together. Hence, the pH of the rinsing liquid is adjusted.

In the present preferred embodiment, the pH adjustment fluid is ammonia water. The pH adjustment fluid is not limited to ammonia water, and may be an ammonia gas, or may be, for example, a fluid including a basic substance other than ammonia. The pH adjustment fluid may be, for example, aqueous potassium hydroxide, TMAH (tetramethylammonium hydroxide), or EDP (ethylenediamine pyrocatechol), etc. Ammonia water and an ammonia gas each contain ammonia molecules that serve as constituents that create ammine complex ions with metal ions such as $Cu^{2+}$, $Co^{3+}$, $Ni^{2+}$, $Mn^{2+}$, etc.

The adjusting unit 13 further includes an oxidation-reduction potential adjustment fluid supply pipe 101, an oxidation-reduction potential adjustment fluid valve 102, and an oxidation-reduction potential adjustment fluid flow-rate adjusting valve 103. The oxidation-reduction potential adjustment fluid supply pipe 101 is joined to the rinsing liquid supply pipe 81 upstream of the rinsing liquid valve 82 and downstream of the degassing unit 84. The oxidation-reduction potential adjustment fluid valve 102 and the oxidation-reduction potential adjustment fluid flow-rate adjusting valve 103 are interposed in the oxidation-reduction potential adjustment fluid supply pipe 101. An oxidation-reduction potential adjustment fluid, such as a hydrogen gas, etc., is supplied from an oxidation-reduction potential adjustment fluid supply source to the oxidation-reduction potential adjustment fluid supply pipe 101. The oxidation-reduction potential adjustment fluid valve 102 opens and closes a flow passage of the oxidation-reduction potential adjustment fluid. The oxidation-reduction potential adjustment fluid flow-rate adjusting valve 103 adjusts the flow rate of the oxidation-reduction potential adjustment fluid supplied from the oxidation-reduction potential adjustment fluid supply pipe 101 to the rinsing liquid supply pipe 81 in accordance with its opening degree. The oxidation-reduction potential adjustment fluid is supplied to the rinsing liquid supply pipe 81, and, as a result, the rinsing liquid and the oxidation-reduction potential adjustment fluid are mixed together. Hence, the oxidation-reduction potential of the rinsing liquid is adjusted.

In the present preferred embodiment, the oxidation-reduction potential adjustment fluid is a mixed gas consisting of an ammonia gas and a hydrogen gas. The oxidation-reduction potential adjustment fluid is not limited to a mixed gas consisting of an ammonia gas and a hydrogen gas. The oxidation-reduction potential adjustment fluid may be a hydrogen gas, a nitrogen gas, an ozone gas, an ammonia gas, etc., or may be a mixed gas in which at least two or more kinds of gases among a hydrogen gas, a nitrogen gas, an ozone gas, and an ammonia gas are mixed together. Additionally, the oxidation-reduction potential adjustment fluid is not limited to a gas, and may be a liquid, such as hypochlorous acid, periodic acid, chlorous acid, nitric acid, ammonium persulfate, hydrogen peroxide water, or ammonia water, etc., or may be a mixture in which at least two or more kinds of liquids among aforementioned liquids are mixed together. Additionally, the oxidation-reduction potential adjustment fluid may be a mixed fluid in which at least one or more kinds of gases among the aforementioned gases and at least one or more kinds of liquids among the aforementioned liquids are mixed together.

The processing unit 2 further includes a branch pipe 36, a branch valve 37, a resistivity meter 15, and an oxidation-reduction potential measuring unit 16. The branch pipe 36 branches from the rinsing liquid supply pipe 81. The branch valve 37 is interposed in the branch pipe 36, and opens and closes a flow passage of the rinsing liquid in the branch pipe 36. The resistivity meter 15 measures the resistivity of the rinsing liquid. The oxidation-reduction potential measuring unit 16 measures the oxidation-reduction potential of the rinsing liquid. The oxidation-reduction potential adjustment fluid supply pipe 101 and the pH adjustment fluid supply pipe 91 make a branch connection to, for example, the same part of the rinsing liquid supply pipe 81. In the rinsing liquid supply pipe 81, the part to which the oxidation-reduction potential adjustment fluid supply pipe 101 and the pH adjustment fluid supply pipe 91 make a branch connection is referred to as a connection portion 81a. The branch pipe 36 and the oxidation-reduction potential measuring unit 16 are respectively connected to parts that are downstream of the connection portion 81a and that are upstream of the rinsing liquid valve 82. The branch valve 37 is opened, and the rinsing liquid is allowed to flow to the resistivity meter 15, thus making it possible to measure the resistivity value (electric conductivity) of the rinsing liquid. Based on this resistivity value (electric conductivity), it is possible to measure the concentration of the pH adjustment fluid in the rinsing liquid.

In the present preferred embodiment, the chemical liquid nozzle 40, the pre-rinsing liquid nozzle 50, the inert gas nozzle 60, the organic solvent nozzle 70, and the rinsing liquid nozzle 80 are commonly housed in a nozzle housing member 35 that is inserted into the internal space of the hollow shaft 30 and into the leading hole 7b of the blocking plate 7.

Figure 3:
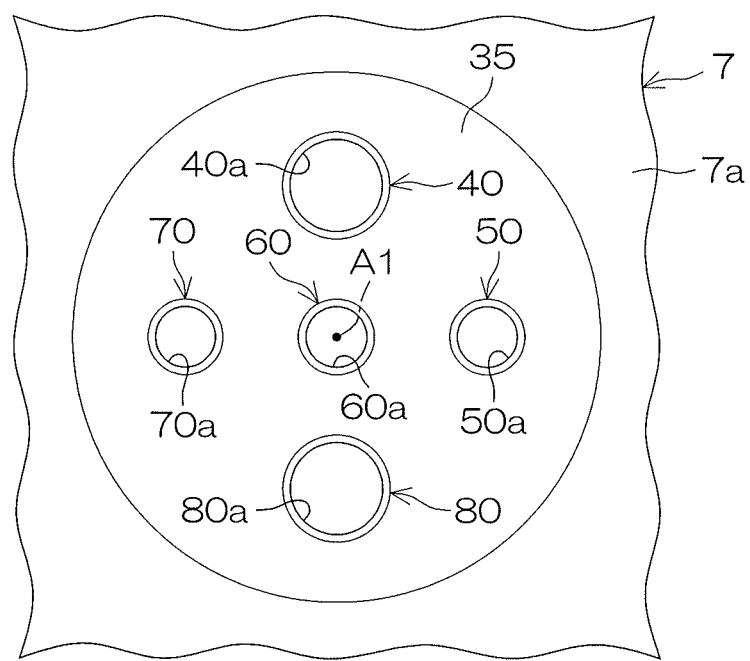
FIG. 3 is a bottom view of a nozzle housing member provided in the processing unit and its periphery.

FIG. 3 is a bottom view of the nozzle housing member 35 and its periphery. The chemical liquid nozzle 40 has a discharge port 40a that is exposed from a lower end of the nozzle housing member 35 and that faces the upper surface of the substrate W. The pre-rinsing liquid nozzle 50 has a discharge port 50a that is exposed from the lower end of the nozzle housing member 35 and that faces the upper surface of the substrate W. The inert gas nozzle 60 has a discharge port 60a that is exposed from the lower end of the nozzle housing member 35 and that faces the upper surface of the substrate W. The organic solvent nozzle 70 has a discharge port 70a that is exposed from the lower end of the nozzle housing member 35 and that faces the upper surface of the substrate W. The rinsing liquid nozzle 80 has a discharge port 80a that is exposed from the lower end of the nozzle housing member 35 and that faces the upper surface of the substrate W.

The discharge port 60a of the inert gas nozzle 60 is placed at a position that overlaps the rotational axis A1 in a plan view. The remaining discharge ports 40a, 50a, 70a, and 80a are evenly spaced around the rotational axis A1 so as to surround the discharge port 60a. The discharge port 40a of the chemical liquid nozzle 40 is positioned on the side opposite to the discharge port 80a of the rinsing liquid nozzle 80 with respect to the discharge port 60a of the inert gas nozzle 60. The discharge port 50a of the pre-rinsing liquid nozzle 50 is positioned on the side opposite to the discharge port 70a of the organic solvent nozzle 70 with respect to the discharge port 60a of the inert gas nozzle 60.

Figure 4:
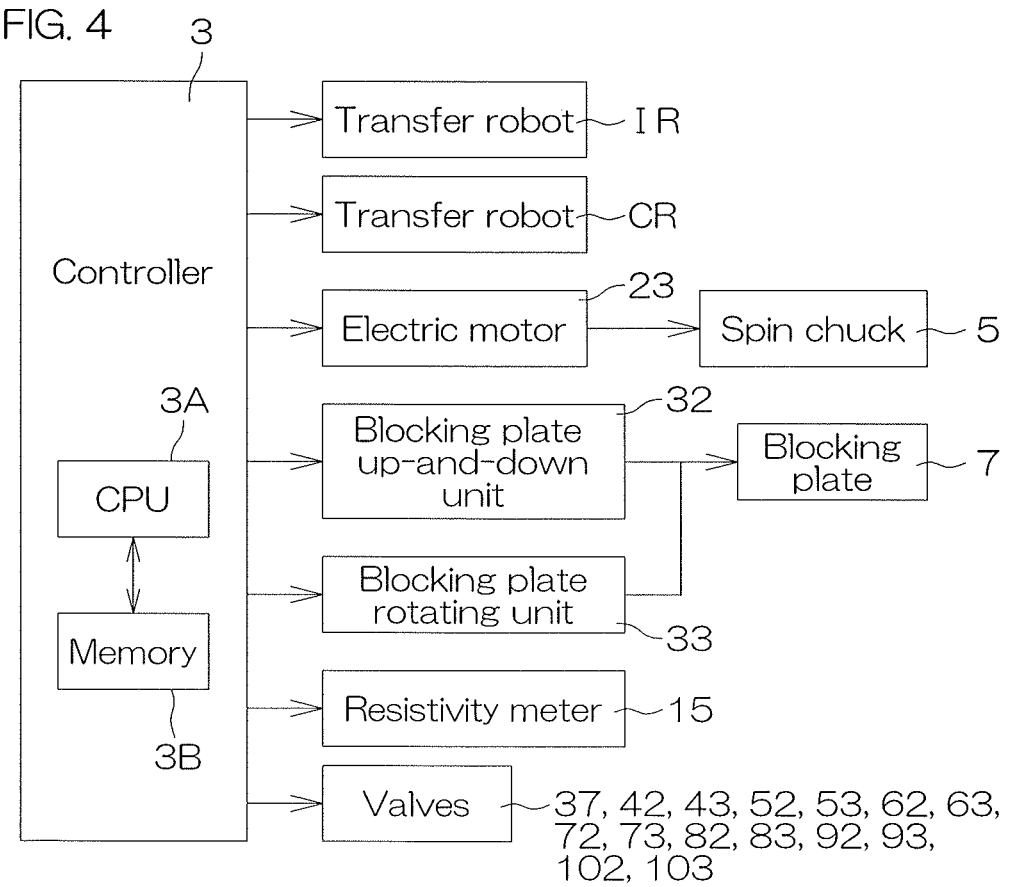
FIG. 4 is a block diagram to describe an electrical configuration of a main portion of the substrate processing apparatus.

FIG. 4 is a block diagram to describe an electrical configuration of a main portion of the substrate processing apparatus 1. The controller 3 is provided with a microcomputer, and controls control objects that are included in the substrate processing apparatus 1 in accordance with a predetermined program. More specifically, the controller 3 includes a processor (CPU) 3A and a memory 3B in which a program is stored, and is configured to perform various control operations for substrate processing by allowing the processor 3A to execute a program. Particularly, the controller 3 controls the operations of the transfer robots IR and CR, the electric motor 23, the blocking plate up-and-down unit 32, the blocking plate rotating unit 33, the resistivity meter 15, the valves 37, 42, 43, 52, 53, 62, 63, 72, 73, 82, 83, 92, 93, 102, 103, and so on.

Figure 5:
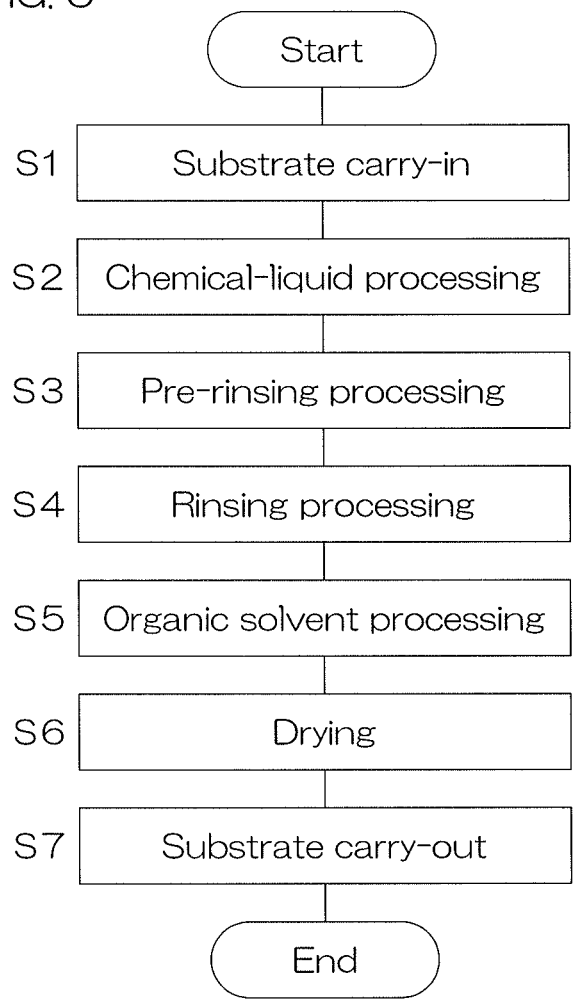
FIG. 5 is a flowchart to describe an example of substrate processing performed by the substrate processing apparatus.

FIG. 5 is a flowchart to describe an example of substrate processing performed by the substrate processing apparatus 1, and chiefly shows processing achieved by allowing the controller 3 to execute a program.

In substrate processing performed by the substrate processing apparatus 1, substrate carry-in (S1), chemical-liquid processing (S2), pre-rinsing processing (S3), rinsing processing (S4), organic solvent processing (S5), drying processing (S6), and substrate carry-out (S7) are performed in this order, for example, as shown in FIG. 5. FIG. 6A to FIG. 6E are illustrative cross-sectional views to describe the substrate processing.

First, in the substrate processing performed by the substrate processing apparatus 1, a substrate W having an upper surface on which a metal is exposed is carried into the processing unit 2 from the carrier C, and is delivered to the spin chuck 5 by means of the transfer robots IR and CR (S1). Thereafter, the substrate W is horizontally held by the chuck pins 20 with an interval created upwardly from an upper surface of the spin base 21 until the substrate W is carried out by means of the transfer robot CR (substrate holding step). Thereafter, the electric motor 23 rotates the spin base 21. Hence, the rotation of the substrate W is started (substrate rotating step).

Figure 6A:
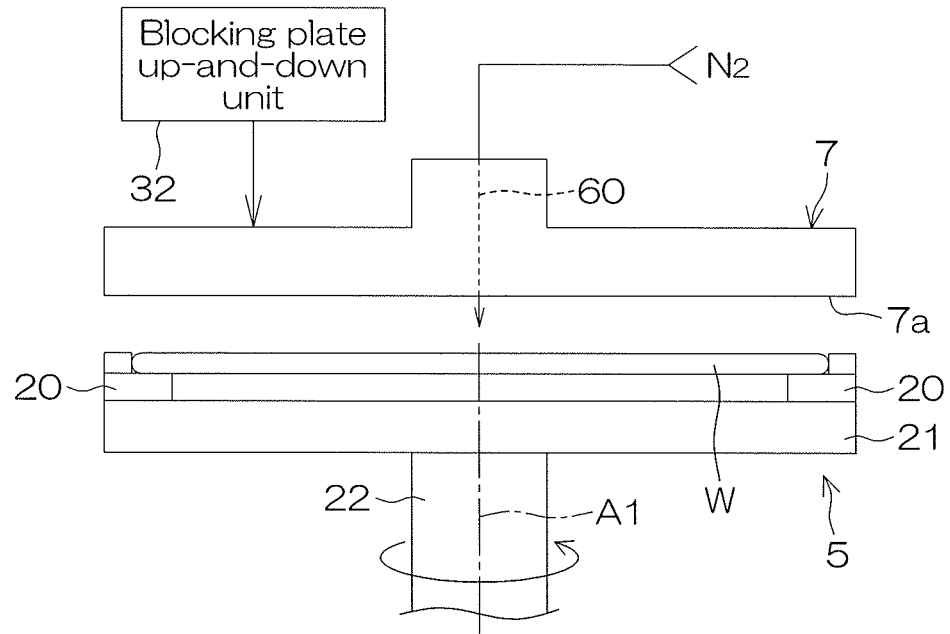
FIG. 6A is an illustrative cross-sectional view to describe the substrate processing.

Thereafter, the blocking plate up-and-down unit 32 lowers the blocking plate 7, and places the blocking plate 7 at a proximal position as shown in FIG. 6A (proximity step). Thereafter, the inert gas valve 62 is opened. Hence, the supply of an inert gas is started from the inert gas nozzle 60 to a space between the upper surface of the substrate W and the facing surface 7a of the blocking plate 7 (inert gas supplying step). Hence, an atmosphere around the upper surface of the substrate W is replaced with the inert gas (inert gas replacing step). The supply of the inert gas is continuously performed until the organic solvent processing (S5) is ended.

Figure 6B:
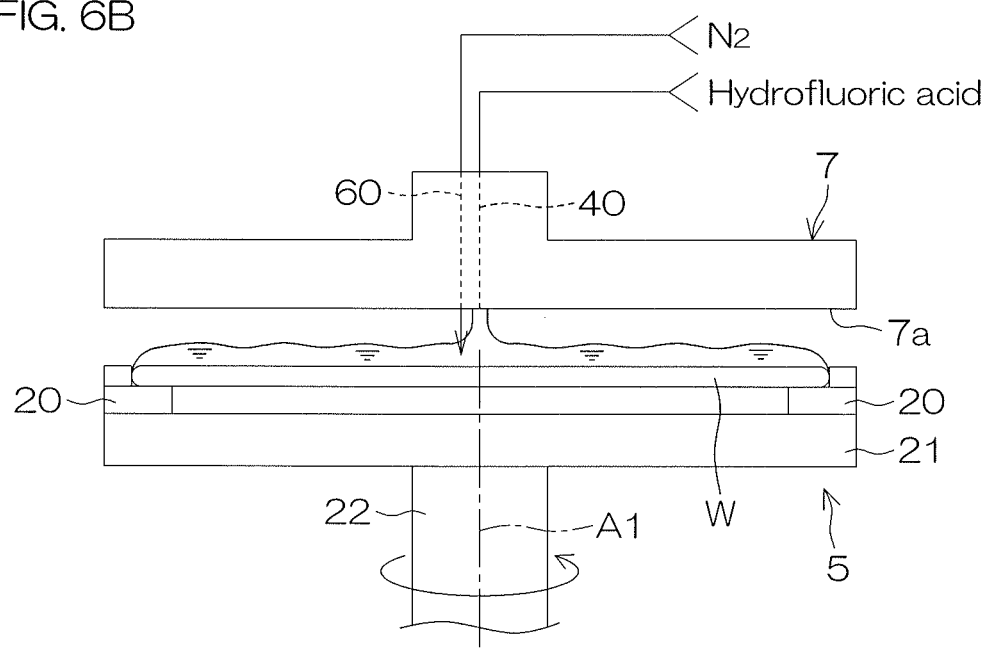
FIG. 6B is an illustrative cross-sectional view to describe the substrate processing.

Next, the chemical-liquid processing (S2) in which the upper surface of the substrate W is treated with a chemical liquid is started. In detail, the chemical liquid valve 42 is opened. Hence, the supply of the chemical liquid to the upper surface of the substrate W is started as shown in FIG. 6B (chemical liquid supplying step). The chemical liquid supplied thereto spreads on the entirety of the upper surface of the substrate W due to a centrifugal force. Hence, the upper surface of the substrate W is treated with the chemical liquid.

Next, the chemical-liquid processing (S2) is performed during a fixed period of time, and then the pre-rinsing processing (S3) in which the chemical liquid is removed from on the substrate W by replacing the chemical liquid existing on the substrate W with a pre-rinsing liquid is performed.

Figure 6C:
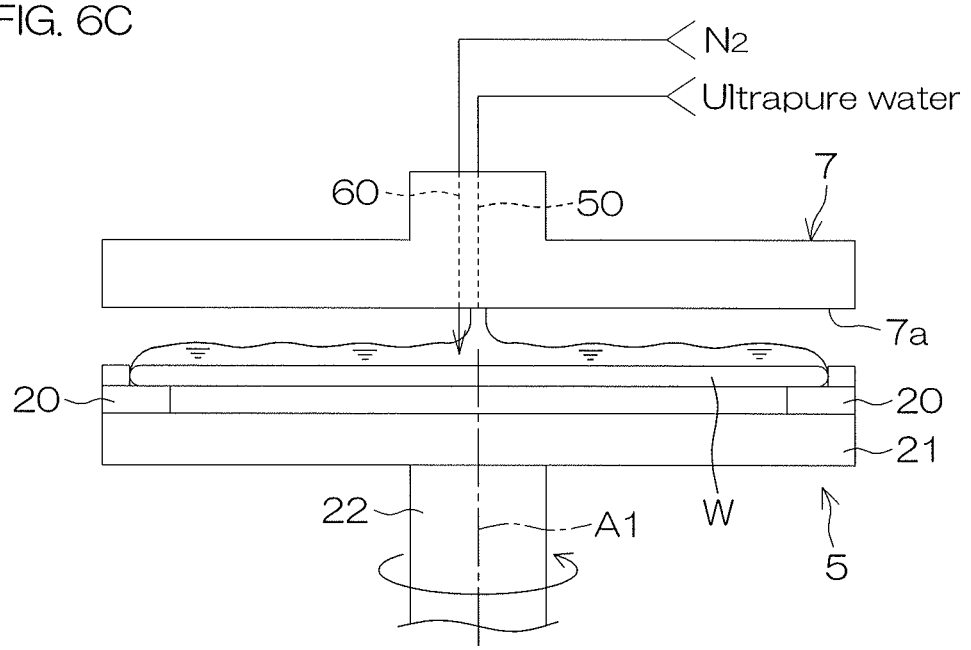
FIG. 6C is an illustrative cross-sectional view to describe the substrate processing.

In detail, the pre-rinsing liquid valve 52 is opened, and the chemical liquid valve 42 is closed. Hence, the supply of the chemical liquid to the upper surface of the substrate W is stopped, and the supply of the pre-rinsing liquid to the upper surface of the substrate W is started as shown in FIG. 6C. The pre-rinsing liquid, such as ultrapure water, etc., that has been supplied thereto spreads on the entirety of the upper surface of the substrate W due to a centrifugal force, and the chemical liquid adhering to the upper surface of the substrate W is washed away by means of the pre-rinsing liquid (pre-rinsing liquid supplying step).

Preferably, in the pre-rinsing liquid supplying step, the supply flow rate of the pre-rinsing liquid and the rotational speed (rotational frequency) of the substrate W are reduced in order to reduce the amount of oxygen dissolution into the pre-rinsing liquid on the substrate W from an atmosphere around the upper surface of the substrate W and in order to reduce the electric charge amount of the upper surface of the substrate W. In detail, the rotational speed (rotational frequency) of the substrate W is, preferably, 1000 rpm or less, and, more preferably, 200 rpm or less. Preferably, the supply flow rate of the pre-rinsing liquid is 0.5 L/min or less.

In the present preferred embodiment, in the pre-rinsing liquid supplying step, the pre-rinsing liquid flow-rate adjusting valve 53 is adjusted such that the supply flow rate of the pre-rinsing liquid becomes a low flow rate of 0.5 L/min or less, and the electric motor 23 is controlled such that the rotational speed (rotational frequency) of the substrate W becomes a low speed of 200 rpm or less. As thus described, in the substrate rotating step performed in the pre-rinsing liquid supplying step, the substrate W is rotated at 200 rpm or less.

Next, the pre-rinsing processing (S3) is performed during a fixed period of time, and then the rinsing processing (S4) is performed to replace the pre-rinsing liquid on the substrate W with a rinsing liquid.

Figure 6D:
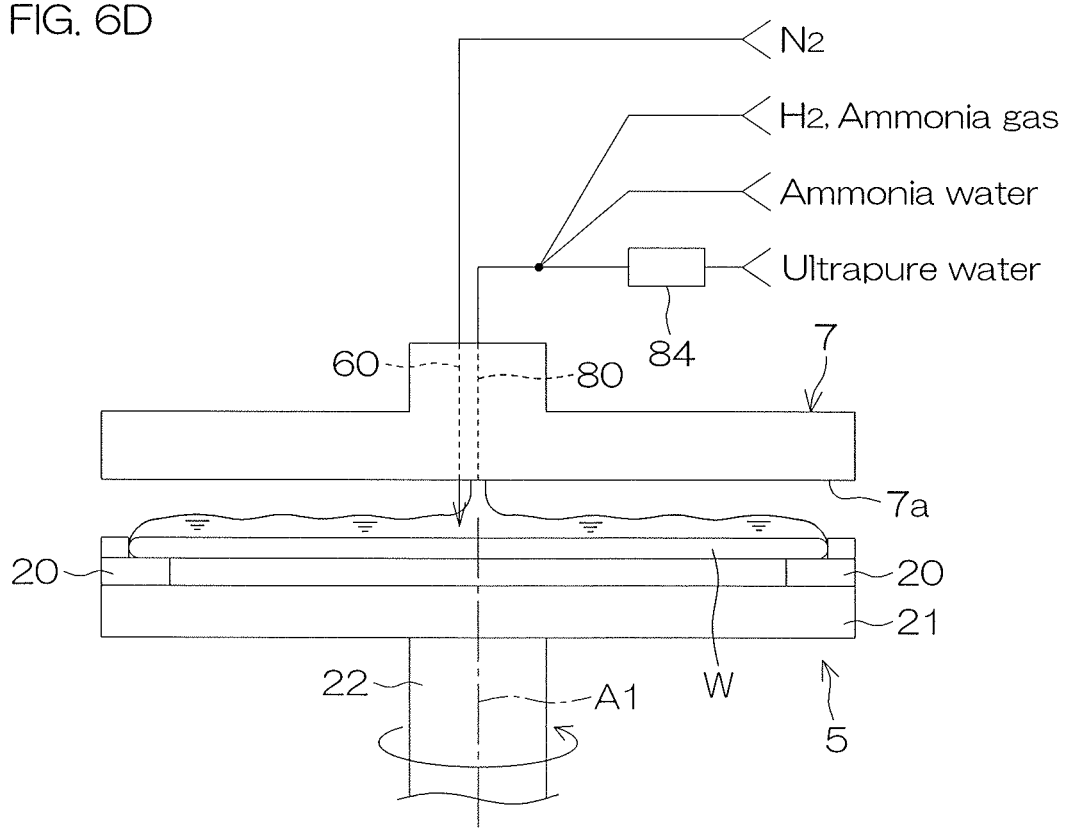
FIG. 6D is an illustrative cross-sectional view to describe the substrate processing.

In detail, the rinsing liquid valve 82 is opened, and the pre-rinsing liquid valve 52 is closed. At this time, the pH adjustment fluid valve 92 and the oxidation-reduction potential adjustment fluid valve 102 are also opened. Hence, the supply of the pre-rinsing liquid to the upper surface of the substrate W is stopped, and a rinsing liquid whose pH and oxidation-reduction potential have been adjusted is discharged from the rinsing liquid nozzle 80, and is supplied to the upper surface of the substrate W as shown in FIG. 6D (rinsing liquid supplying step). Hence, the pre-rinsing liquid adhering to the upper surface of the substrate W is washed away by means of the rinsing liquid.

Figure 7A:
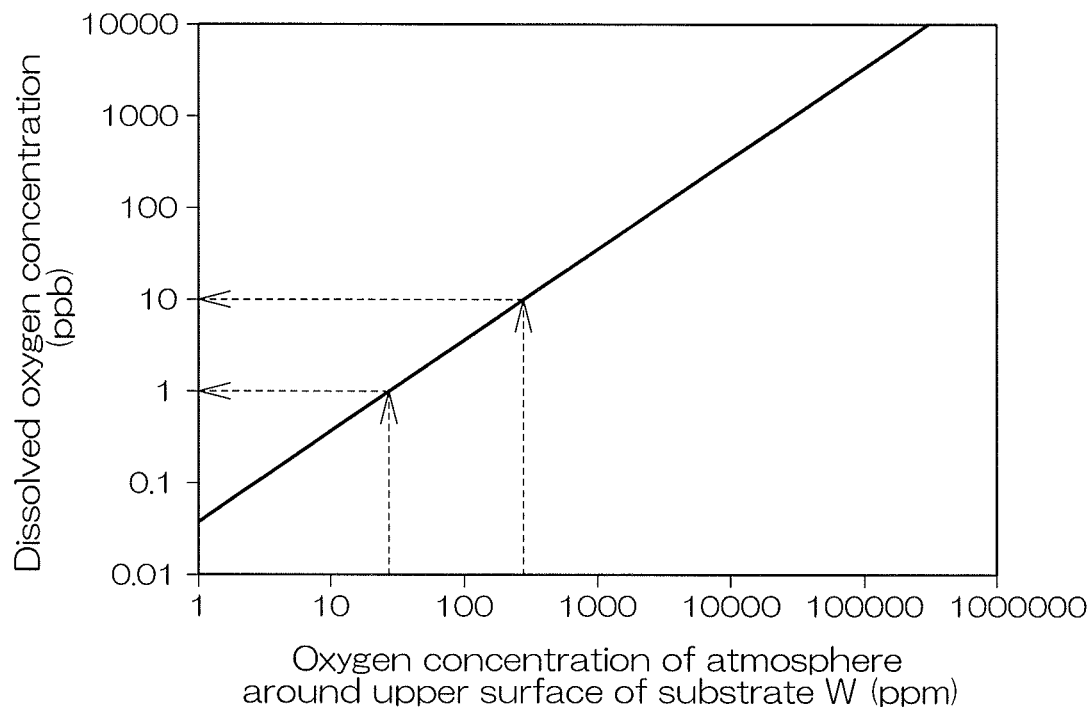
FIG. 7A is a graph showing a relationship between an oxygen concentration of an atmosphere around an upper surface of a substrate and a dissolved oxygen concentration in a rinsing liquid.

The dissolved oxygen concentration in the rinsing liquid on the substrate W is, preferably, 10 ppb or less, and, more preferably, 1 ppb or less. FIG. 7A is a graph showing a relationship between an oxygen concentration of an atmosphere around the upper surface of the substrate W and a dissolved oxygen concentration in the rinsing liquid. With reference to FIG. 7A, it is possible to reduce the dissolved oxygen concentration in the rinsing liquid on the substrate W to 10 ppb or less if the oxygen concentration of the atmosphere around the upper surface of the substrate W is 250 ppm or less when the rinsing liquid supplying step is started. It is possible to reduce the dissolved oxygen concentration in the rinsing liquid on the substrate W to 1 ppb or less if the oxygen concentration of the atmosphere around the upper surface of the substrate W is 25 ppm or less.

Figure 7B:
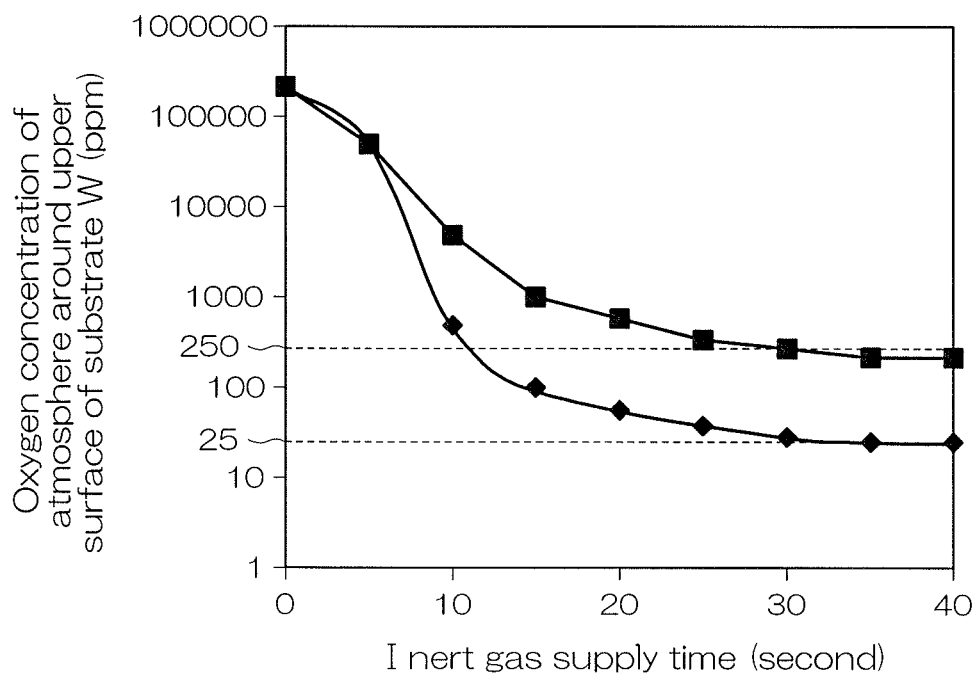
FIG. 7B is a graph showing a relationship between an inert-gas supply time and an oxygen concentration of an atmosphere around the upper surface of the substrate.

FIG. 7B is a graph showing a relationship between an inert-gas supply time and an oxygen concentration of an atmosphere around the upper surface of the substrate W. With reference to FIG. 7B, in order to set the oxygen concentration of the atmosphere around the upper surface of the substrate W at about 250 ppm or less, it is needed to set the width between the upper surface of the substrate W and the facing surface 7a of the blocking plate 7 in the proximal position at 10 mm or less and to discharge an inert gas at 200 L/min or more for about 40 seconds (see "■" of FIG. 7B). Additionally, in order to set the oxygen concentration of the atmosphere around the upper surface of the substrate W at about 25 ppm or less, it is needed to set the width between the upper surface of the substrate W and the facing surface 7a of the blocking plate 7 in the proximal position at 5 mm or less and to discharge an inert gas at 300 L/min or more for about 40 seconds (see "◆" of FIG. 7B).

Next, the rinsing processing (S4) is performed during a fixed period of time, and then the organic solvent processing (S5) is performed to replace the rinsing liquid on the substrate W with an organic solvent and to remove the rinsing liquid from on the substrate W.

In detail, the organic solvent valve 72 is opened, and the rinsing liquid valve 82, the pH adjustment fluid valve 92, and the oxidation-reduction potential adjustment fluid valve 102 are closed. Hence, the supply of the rinsing liquid to the upper surface of the substrate W is stopped, and the supply of the organic solvent, such as IPA, etc., to the upper surface of the substrate W is started as shown in FIG. 6E. The organic solvent supplied thereto spreads on the entirety of the upper surface of the substrate W due to a centrifugal force, and the rinsing liquid on the upper surface of the substrate W is replaced with the organic solvent (organic solvent replacing step).

Next, the drying processing (S6) in which the substrate W is dried is performed.

In detail, the organic solvent valve 72 is closed. Thereafter, the blocking plate up-and-down unit 32 moves the blocking plate 7 to the lower position, and the electric motor 23 rotates the substrate W at a high speed (for example, 3000 rpm). Hence, a great centrifugal force acts on the organic solvent existing on the substrate W, and therefore the organic solvent existing on the substrate W is shaken off toward the surroundings of the substrate W. The organic solvent is removed from the substrate W in this way, and the substrate W is dried. Thereafter, when a predetermined time elapses after the high-speed rotation of the substrate W is started, the electric motor 23 stops the rotation of the substrate W performed by the spin base 21.

Thereafter, the transfer robot CR enters the processing unit 2, and then scoops an already-processed substrate W from the spin chuck 5, and carries the substrate W out of the processing unit 2 (S7). This substrate W is delivered from the transfer robot CR to the transfer robot IR, and is stored in the carrier C by means of the transfer robot IR.

Here, a method for adjusting the pH and oxidation-reduction potential of a rinsing liquid will be described. In the rinsing processing (S4), a not-yet-adjusted rinsing liquid that is supplied from the rinsing liquid supply source, a pH adjustment fluid, and an oxidation-reduction potential adjustment fluid are mixed together in the rinsing liquid supply pipe 81 as shown in FIG. 6D. Hence, the pH and oxidation-reduction potential of the rinsing liquid are adjusted (adjusting step). In detail, an adjusting step is performed by opening the pH adjustment fluid valve 92 and the oxidation-reduction potential adjustment fluid valve 102. The pH and oxidation-reduction potential of the rinsing liquid are adjusted to reach a desired value by adjusting the opening degree of the pH adjustment fluid flow-rate adjusting valve 93 and the opening degree of the oxidation-reduction potential adjustment fluid flow-rate adjusting valve 103. The rinsing liquid is degassed by passing through the degassing unit 84 before being mixed with the pH adjustment fluid and the oxidation-reduction potential adjustment fluid (degassing step).

In the adjusting step, the pH and oxidation-reduction potential of the rinsing liquid are adjusted to create an inactive state in which a metal exposed from the upper surface of the substrate W does not react with the rinsing liquid. Alternatively, in the adjusting step, the pH and oxidation-reduction potential of the rinsing liquid are adjusted such that the metal and the rinsing liquid react with each other, and, as a result, a passive state is created. It is possible to adjust the pH of the rinsing liquid so as to fall within the range of 7 or more to 10 or less by mixing ammonia water with the rinsing liquid.

Here, the adjustable range of the pH and oxidation-reduction potential of the rinsing liquid will be described in detail with reference to FIG. 8A and FIG. 8B.

Figure 8A:
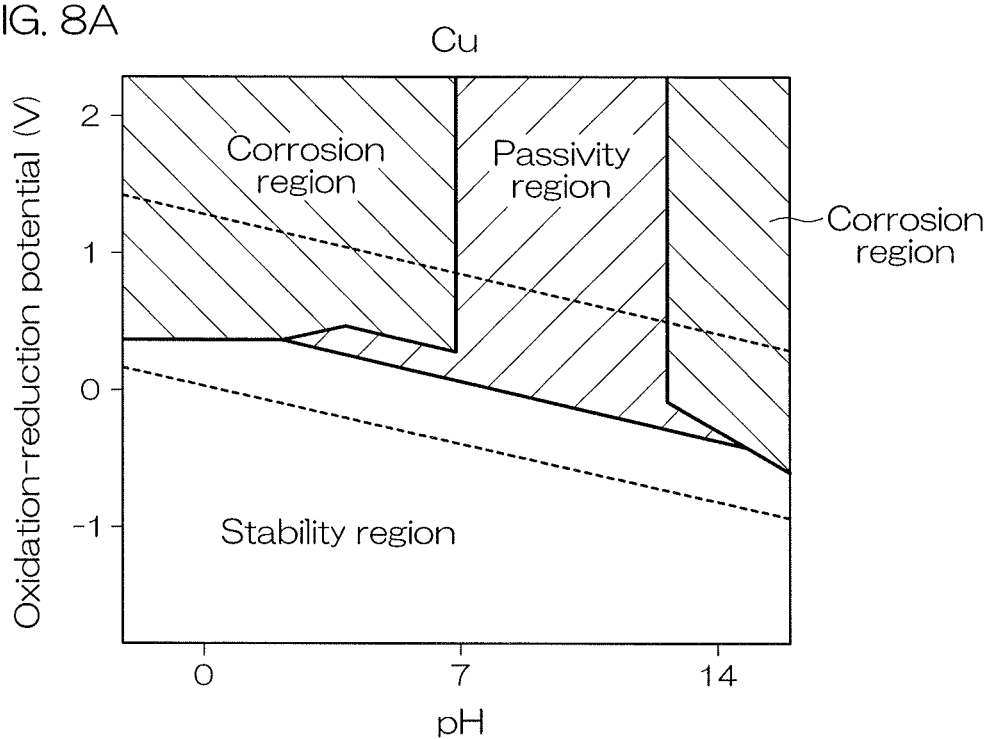
FIG. 8A is a potential-pH diagram of Cu.

FIG. 8A is a potential-pH diagram of copper (Cu). When a combination of the pH and oxidation-reduction potential of the rinsing liquid is in a corrosion region, a Cu film exposed from the upper surface of the substrate W is corroded. When a combination of the pH and oxidation-reduction potential of the rinsing liquid is in a passivity region, the Cu film and hydroxide ions ($OH^-$) or oxide ions ($O^{2-}$) in the rinsing liquid react with each other, and passivity such as copper hydroxide [$Cu(OH)_2$] or of copper oxide $CuO$, etc., is created on a surface of the Cu film. When a combination of the pH and oxidation-reduction potential of the rinsing liquid is in a stability region, the Cu film does not react with ions in the rinsing liquid. In other words, when a combination of the pH and oxidation-reduction potential of the rinsing liquid is in a stability region, the Cu film creates an inactive state.

Therefore, in FIG. 8A, in order to prevent the Cu film of the upper surface of the substrate W from being corroded, it is needed to adjust the pH and oxidation-reduction potential of the rinsing liquid so as to correspond to a region (passivity region or stability region) other than the corrosion region. If the pH of the rinsing liquid is adjusted to reach a value falling within the range of not less than 7 and not more than 10 and if the oxidation-reduction potential of the rinsing liquid is adjusted to reach a value falling within the range of not less than −0.5 V and not more than 1.0 V, it is possible to reliably prevent the Cu film from being corroded.

Figure 8B:
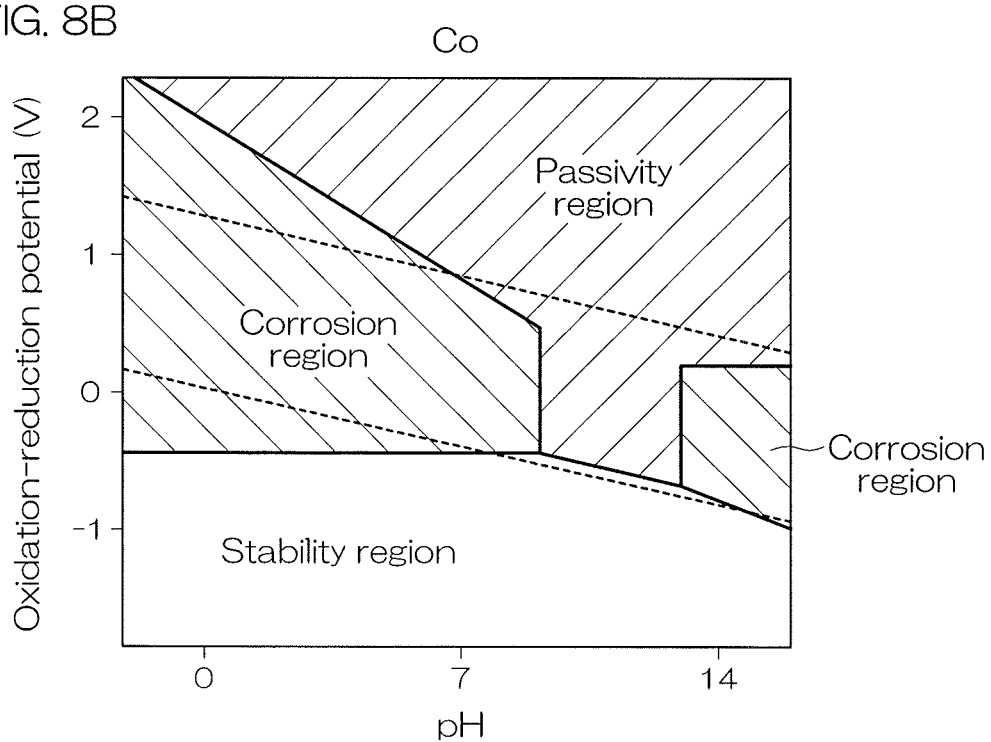
FIG. 8B is a potential-pH diagram of Co.

FIG. 8B is a potential-pH diagram of Co. When a Co film is exposed from the upper surface of the substrate W, it is needed to adjust the pH and oxidation-reduction potential of the rinsing liquid so as to correspond to a region (passivity region or stability region) other than the corrosion region in FIG. 8B.

The position or the size of each region depends on a metallic species, and therefore if the pH and oxidation-reduction potential of the rinsing liquid are adjusted so as to avoid the corrosion region on the basis of the potential-pH diagram of the each metallic species, it is possible to reliably prevent the metal from being corroded.

In the present preferred embodiment, ultrapure water is used as the rinsing liquid, and the oxidation-reduction potential of the rinsing liquid is adjusted by a mixed gas consisting of an ammonia gas and a hydrogen gas. The use of a mixed gas consisting of an ammonia gas and a hydrogen gas makes it possible to adjust the oxidation-reduction potential of the rinsing liquid so as to reach −0.42 V. Additionally, in the present preferred embodiment, the pH of the rinsing liquid is adjusted by ammonia water. Therefore, it is possible to adjust the pH of the rinsing liquid by use of ammonia water so as to reach 10.

With reference to FIG. 8A, if the pH and oxidation-reduction potential of the rinsing liquid are adjusted such that the pH becomes 10 and such that the oxidation-reduction potential becomes −0.42 V (pH=10, ORP=−0.42), it is possible to allow the value of the pH of the rinsing liquid and the value of the oxidation-reduction potential of the rinsing liquid to fall within the stability region of the potential-pH diagram of Cu. Therefore, it is possible to reliably prevent the Cu film from being corroded.

If hypochlorous acid is used as the oxidation-reduction potential adjustment fluid unlike the present preferred embodiment, it is possible to adjust the oxidation-reduction potential of the rinsing liquid so as to become 0.69 V. If periodic acid is used as the oxidation-reduction potential adjustment fluid, it is possible to adjust the oxidation-reduction potential of the rinsing liquid so as to become 0.52 V. If chlorous acid is used as the oxidation-reduction potential adjustment fluid, it is possible to adjust the oxidation-reduction potential of the rinsing liquid so as to become 0.48 V. If nitric acid is used as the oxidation-reduction potential adjustment fluid, it is possible to adjust the oxidation-reduction potential of the rinsing liquid so as to become 0.22 V. If ammonium persulfate is used as the oxidation-reduction potential adjustment fluid, it is possible to adjust the oxidation-reduction potential of the rinsing liquid so as to become 0.14 V. If hydrogen peroxide water is used as the oxidation-reduction potential adjustment fluid, it is possible to adjust the oxidation-reduction potential of the rinsing liquid so as to become 0.02 V. If ammonia gas or ammonia water is used as the oxidation-reduction potential adjustment fluid, it is possible to adjust the oxidation-reduction potential of the rinsing liquid so as to become −0.3 V. If a mixed fluid consisting of ammonia water and hydrogen is used as the oxidation-reduction potential adjustment fluid, it is possible to adjust the oxidation-reduction potential of the rinsing liquid so as to become −0.42 V.

With reference to FIG. 8A, if these oxidation-reduction potential adjustment fluids are first adjusted such that the pH of the rinsing liquid becomes 10 and are then used, it is possible to allow the value of the pH of the rinsing liquid and the value of the oxidation-reduction potential of the rinsing liquid to fall within the stability region or the passivity forming region of the potential-pH diagram of Cu. Therefore, it is possible to reliably prevent the Cu film from being corroded.

With reference to FIG. 8B, if these oxidation-reduction potential adjustment fluids are likewise used even when the metal film is a Co film, it is possible to allow the value of the pH of the rinsing liquid and the value of the oxidation-reduction potential of the rinsing liquid to fall within the stability region or the passivity forming region of the potential-pH diagram of Co. Therefore, it is possible to reliably prevent the Co film from being corroded.

Additionally, unlike the present preferred embodiment, it is conceivable that the pH adjustment fluid and the oxidation-reduction potential adjustment fluid are not mixed with the rinsing liquid. If so, the pH of the rinsing liquid is 7, and the oxidation-reduction potential is 0.25 V (pH=7, ORP=0.25). Even in this case, it is possible to allow the value of the pH of the rinsing liquid and the value of the oxidation-reduction potential of the rinsing liquid to fall within the passivity forming region if the metal film is a Cu film. Therefore, it is possible to prevent the Cu film from being corroded.

A description will be hereinafter given of a result of an experiment performed to examine an influence exerted on the amount of corrosion (amount of etching) of a metal by means of the pH and oxidation-reduction potential of the rinsing liquid with reference to FIG. 9 to FIG. 11C. In this experiment, a substrate W having an upper surface on which a metal film is exposed was used. In this experiment, the thickness of the metal film that is exposed on the upper surface of the substrate W after the substrate W is rinsed with a rinsing liquid was measured. The thickness of the metal film was measured by use of a sheet resistor (RS-100) produced by the KLA-Tencor Corporation. The amount of loss of the metal film corresponds to the amount of etching of the metal film.

In this experiment, a wafer whose radius is 150 mm was used as the substrate W. In this experiment, a nitrogen gas was discharged from the inert gas nozzle 60 at a rate of 240 L/min. In this experiment, the rotational speed of the substrate W was set at 1000 rpm. In this experiment, a rinsing liquid whose pH and oxidation-reduction potential had been adjusted was discharged to the substrate W, and rinsing was performed during each of a plurality of processing periods of time (60 seconds, 300 seconds, 600 seconds), and then the amount of etching of the metal film was measured.

First, a description will be given of a measurement result of the amount of etching when a substrate W whose metal film is a Cu film was used.

Figure 9:
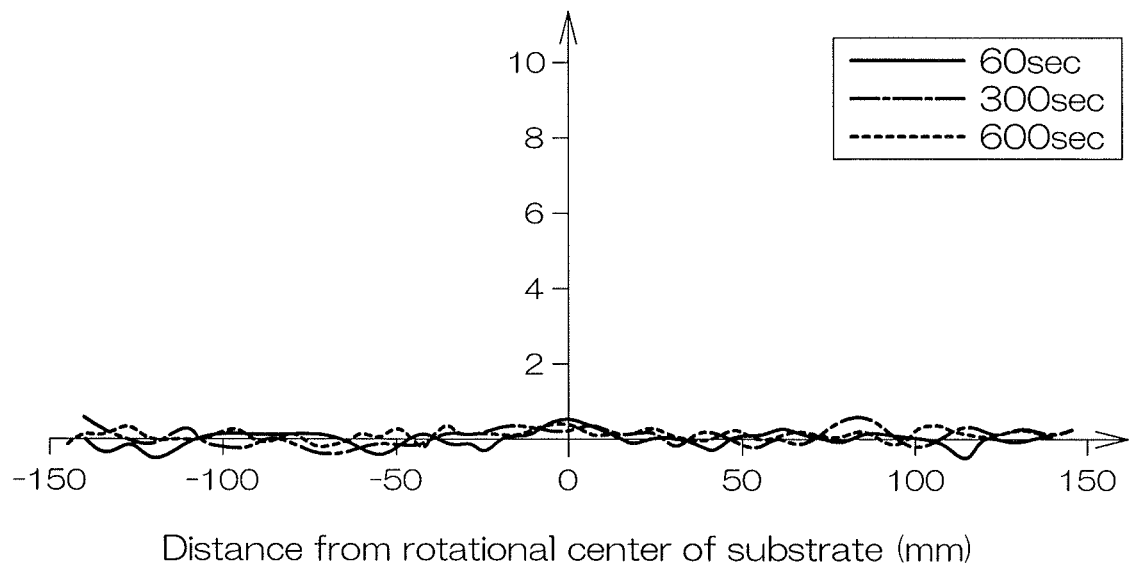
FIG. 9 is a graph showing a result obtained by measuring the amount of etching of a Cu film when a substrate is rinsed with DIW (pH=7).

In FIG. 9, the abscissa axis represents a distance from a rotational center of the substrate W, and the ordinate axis represents the amount of etching of the Cu film. In the abscissa axis, the rotational center of the substrate W is set as an origin. In the abscissa axis, a position away from the rotational center of the substrate W toward one side along a straight line perpendicular to the rotational axis A1 is defined as positive, whereas a position away from the rotational center of the substrate W toward the other side along the straight line is defined as negative.

FIG. 9 shows an experimental result when DIW whose pH is 7 and whose oxidation-reduction potential is about 0.5 V was used as a rinsing liquid (pH=7, ORP=0.5V, DIW rinsing). In this experiment, the amount of etching of the Cu film was substantially constant without depending on the processing time, and the etching of the Cu film hardly occurred.

Figure 10:
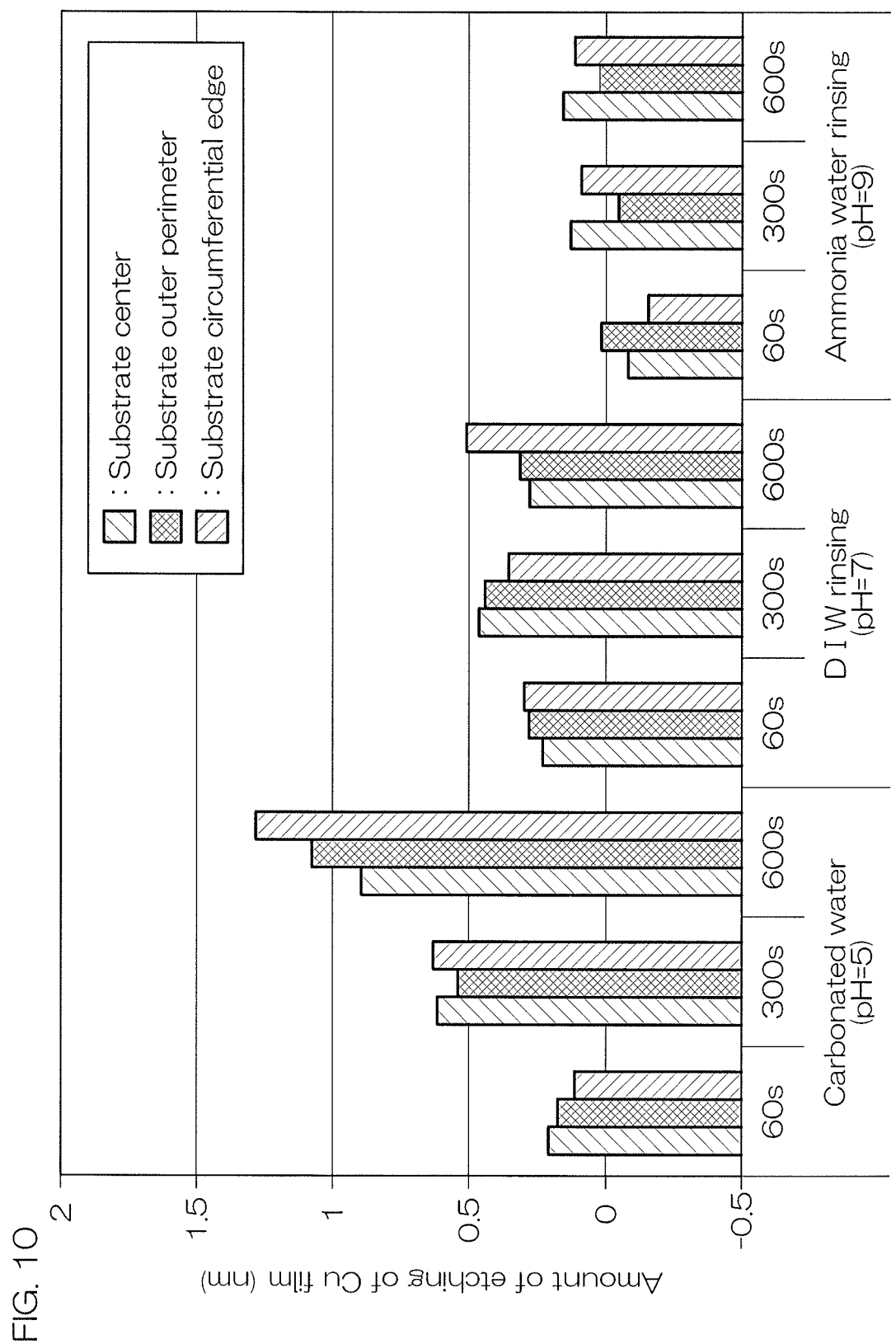
FIG. 10 is a graph showing a result obtained by measuring the amount of etching of a Cu film of each substrate when front surfaces of the substrates are respectively rinsed with three kinds of rinsing liquids that differ in pH.

A similar experiment was performed by using carbonated water whose pH is 5 and whose oxidation-reduction potential is about 0.7 V as the rinsing liquid. Additionally, a similar experiment was performed by using ammonia water whose pH is 9 and whose oxidation-reduction potential is about 0.2 V as the rinsing liquid. A bar chart into which these results are collected is shown in FIG. 10. FIG. 10 is a graph that shows results obtained by measuring the amount of etching of the Cu film of each substrate W when the front surface of the substrate W is rinsed with each of three kinds of rinsing liquids that differ in pH from each other. In FIG. 10, the central area of the upper surface of the substrate W is referred to as a "substrate center." Additionally, in FIG. 10, the outer peripheral area of the upper surface of the substrate W is referred to as a "substrate outer perimeter." Additionally, in FIG. 10, the circumferential edge area of the upper surface of the substrate W is referred to as a "substrate circumferential edge." The circumferential edge area of the upper surface of the substrate W is an area including the circumferential edge of the substrate W. The outer peripheral area of the upper surface of the substrate W is an area between the central area of the upper surface of the substrate W and the circumferential edge area of the upper surface of the substrate W.

As shown in FIG. 10, when ammonia water was used as the rinsing liquid, the amount of etching of the Cu film was substantially constant without depending on the processing time in the same way as when DIW was used as the rinsing liquid. In other words, the etching of the Cu film hardly occurred. On the other hand, when carbonated water was used as the rinsing liquid, the amount of etching of the Cu film increased with the lapse of the processing time.

Next, a description will be given of a measurement result of the amount of etching when a substrate W whose metal film is a Co film was used.

Figure 11A:
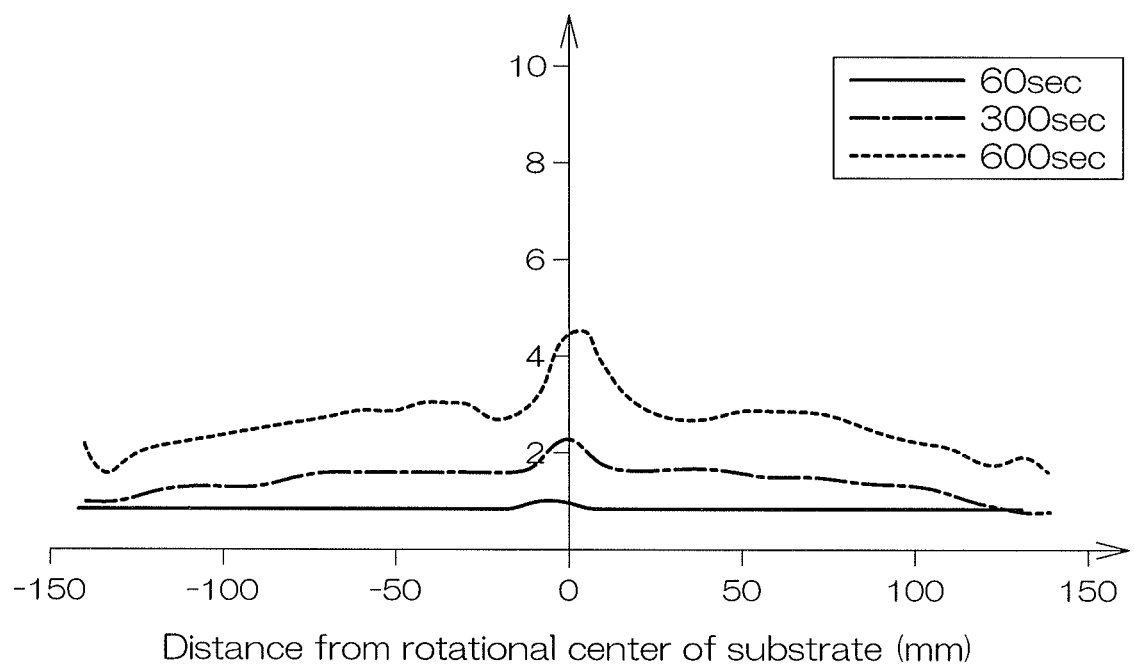
FIG. 11A is a graph showing a result obtained by measuring the amount of etching of a Co film when a substrate is rinsed with carbonated water (pH=5).
Figure 11B:
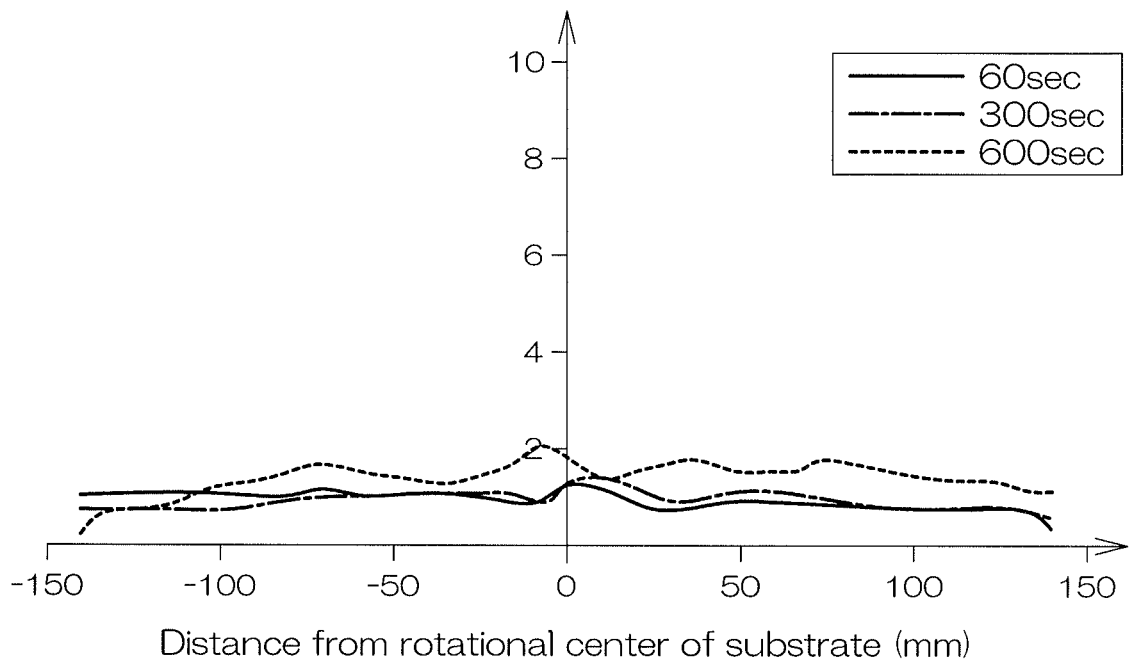
FIG. 11B is a graph showing a result obtained by measuring the amount of etching of a Co film when a substrate is rinsed with DIW (pH=7).
Figure 11C:
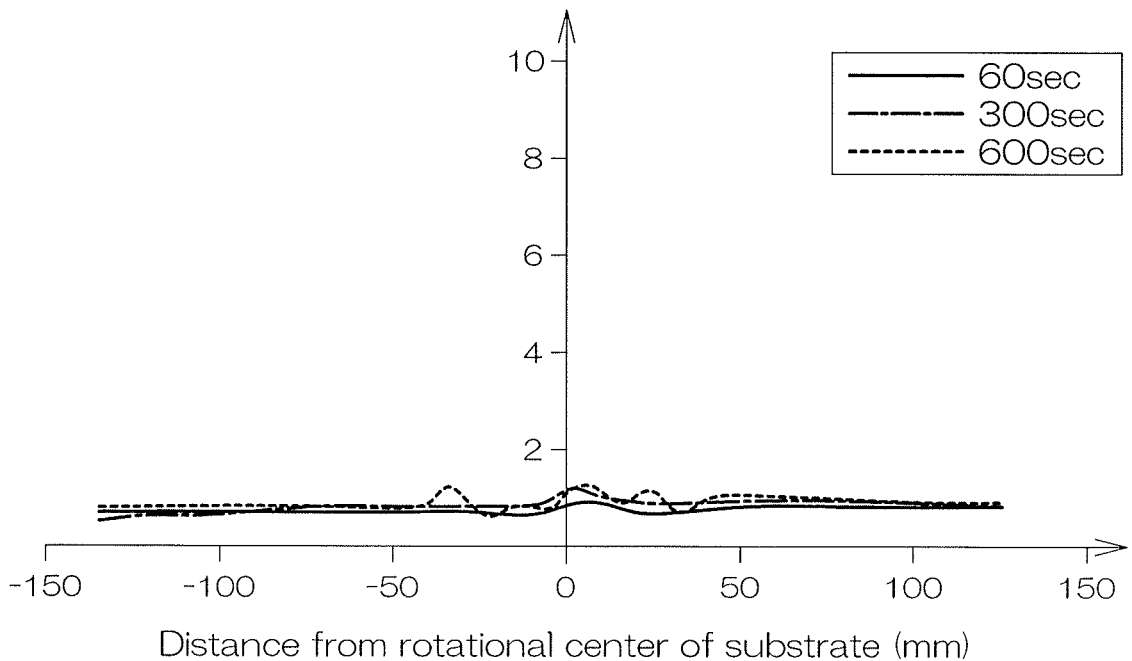
FIG. 11C is a graph showing a result obtained by measuring the amount of etching of a Co film when a substrate is rinsed with ammonia water (pH=9).

In FIG. 11A to FIG. 11C, the abscissa axis represents a distance from the rotational center of the substrate W, and the ordinate axis represents the amount of etching of the Co film. In the abscissa axis, the rotational center of the substrate W is set as an origin. In the abscissa axis, a position away from the rotational center of the substrate W toward one side along a straight line perpendicular to the rotational axis A1 is defined as positive, whereas a position away from the rotational center of the substrate W toward the other side along the straight line is defined as negative.

FIG. 11A shows an experimental result when carbonated water whose pH is 5 and whose oxidation-reduction potential is about 0.7 V was used as the rinsing liquid (pH=5, ORP=0.7 V, carbonated water rinsing). FIG. 11B shows an experimental result when DIW whose pH is 7 and whose oxidation-reduction potential is about 0.5 V was used as the rinsing liquid (pH=7, ORP=0.5 V, DIW rinsing). FIG. 11C shows an experimental result when ammonia water whose pH is 9 and whose oxidation-reduction potential is about 0.2 V was used as the rinsing liquid (pH=9, ORP=0.2 V, ammonia water rinsing). As shown in FIG. 11A and FIG. 11B, when carbonated water or DIW was used as the rinsing liquid, the amount of etching of the Co film increased with the lapse of the processing time. On the other hand, as shown in FIG. 11C, when ammonia water was used as the rinsing liquid, the amount of etching of the Co film was substantially constant without depending on the processing time, and the etching of the Co film hardly occurred.

From the experimental results shown in FIG. 9 to FIG. 11C, it is inferred that it will be possible to prevent the metal from being corroded if the pH and oxidation-reduction potential of the rinsing liquid are adjusted on the basis of the potential-pH diagram of each metallic species. Next, with reference to FIG. 12A to FIG. 12C, a description will be given of results of experiments performed to examine the reduction effect of the amount of etching of a metal brought about by replacing an atmosphere around a substrate W with an inert gas.

In each experiment, rinsing was performed during each of a plurality of processing periods of time (60 seconds, 300 seconds, 600 seconds), and then the thickness of a metal film was measured. In the experiment, a substrate W (Co thin film substrate) having an upper surface on which a Co film is exposed was used. The Co film is a film created by PVD (Physical Vapor Deposition). The thickness of the Co film is about 30 nm.

Figure 12A:
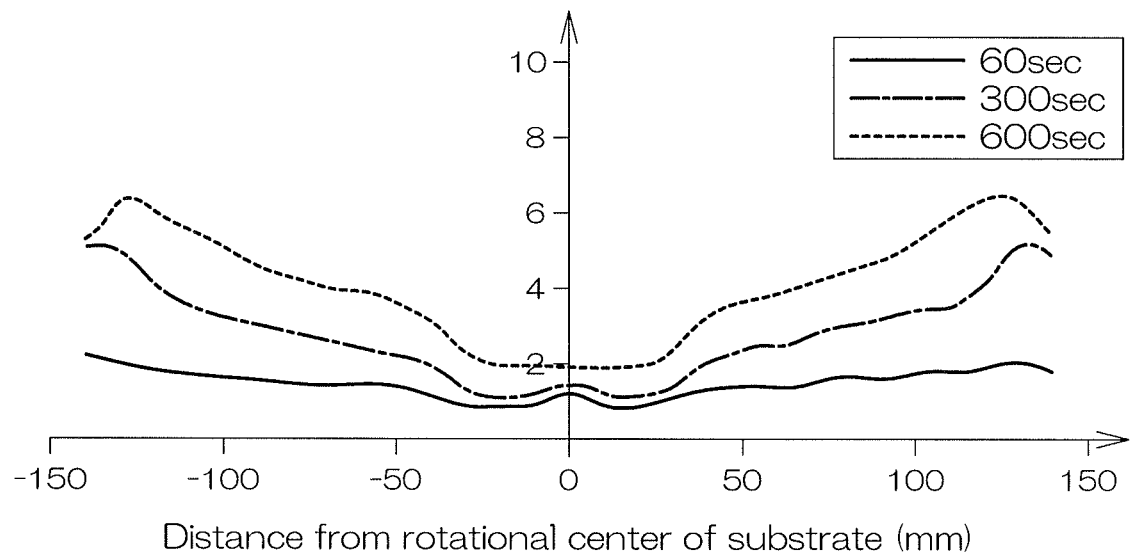
FIG. 12A is a graph showing a result obtained by measuring the amount of etching of a Co film when a substrate is rinsed with DIW without replacing an atmosphere around the substrate with an inert gas.
Figure 12B:
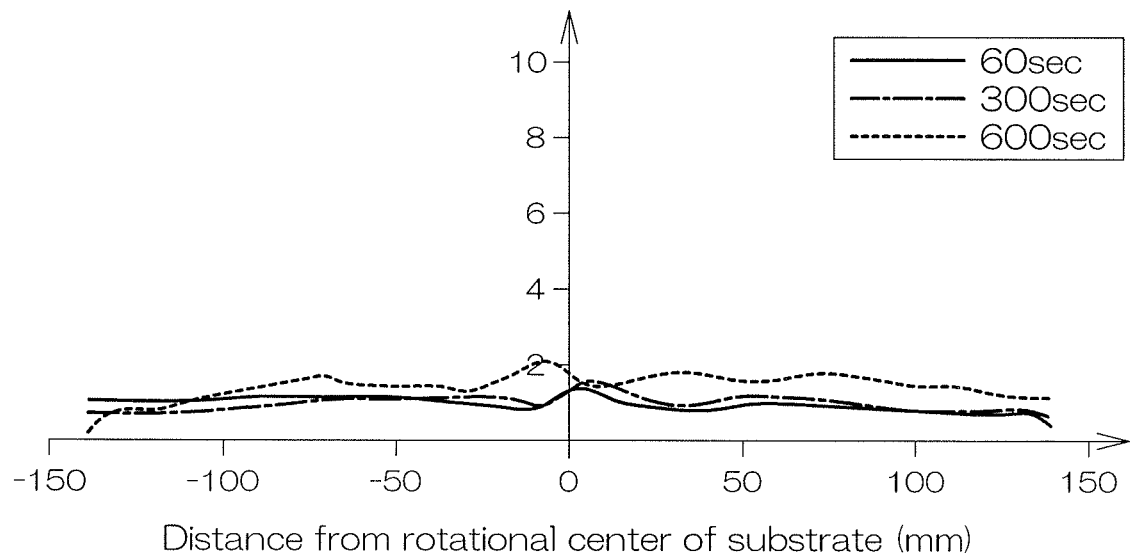
FIG. 12B is a graph showing a result obtained by measuring the amount of etching of a Co film when a substrate is rinsed with DIW in a state in which an atmosphere around the substrate has been replaced with an inert gas.
Figure 12C:
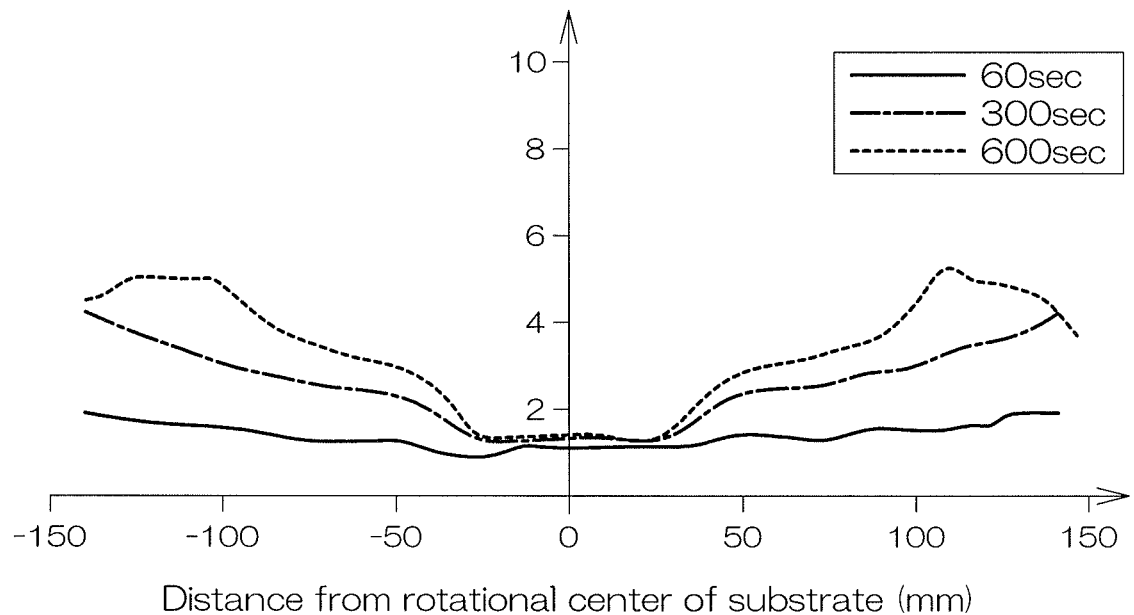
FIG. 12C is a graph showing a result obtained by measuring the amount of etching of a Co film when a substrate is rinsed with ammonia water without replacing an atmosphere around the substrate with an inert gas.

In FIG. 12A to FIG. 12C, the abscissa axis represents a distance from the rotational center of the substrate W, and the ordinate axis represents the amount of etching of the Co film. FIG. 12A shows an experimental result when the substrate W was rinsed with DIW without replacing an atmosphere around the upper surface of the substrate W with an inert gas (Non-execution of $N_2$ replacement, DIW rinsing). FIG. 12B shows an experimental result when the substrate W was rinsed with DIW after replacing an atmosphere around the upper surface of the substrate W with an inert gas (Execution of $N_2$ replacement, DIW rinsing). The atmosphere around the upper surface of the substrate W was replaced until the concentration of a nitrogen gas reached 25 ppm. FIG. 12C shows an experimental result when the substrate W was rinsed with ammonia water without replacing an atmosphere around the upper surface of the substrate W with an inert gas (Non-execution of $N_2$ replacement, ammonia water rinsing).

When the substrate W was rinsed with DIW without replacing an atmosphere around the substrate W with an inert gas, the amount of etching of the Co film increased in proportion to the lapse of the processing time as shown in FIG. 12A. The amount of etching of the Co film increased in proportion to an approach to the circumferential edge of the substrate W from the rotational center of the substrate W. This presumably occurred because oxygen existing in the atmosphere dissolved in the DIW during a period of time during which the DIW supplied to the vicinity of the center of the substrate W approached the circumferential edge of the substrate W. In detail, dissolved oxygen in the DIW contiguous to the circumferential edge of the upper surface of the substrate W becomes higher in concentration than dissolved oxygen in the DIW contiguous to the vicinity of the center of the upper surface of the substrate W. Therefore, presumably, the amount of etching of the Co film increased in proportion to an approach to the circumferential edge of the substrate W.

On the other hand, when the substrate W was rinsed with DIW in a state in which an atmosphere around the substrate W had been replaced with a nitrogen gas, the amount of etching of the Co film increased with the lapse of the processing time as shown in FIG. 12B. However, a change in the amount of etching of the Co film that depends on a distance from the rotational center of the substrate W was not so observed, and the amount of etching was at a substantially equal level at any position of the upper surface of the substrate W.

Additionally, when an atmosphere around the substrate W was not replaced with an inert gas even if the substrate W was rinsed with ammonia water, the amount of etching of the Co film was constant in the vicinity of the center of the substrate W without depending on the processing time as shown in FIG. 12C. However, in this case, the amount of etching of the Co film increased in proportion to an approach to the circumferential edge of the substrate W.

From this result, it is inferred that it will be possible to restrain the etching of a metal film resulting from dissolved oxygen by replacing an atmosphere around the upper surface of the substrate W with an inert gas. Additionally, it is inferred that it will be impossible to satisfactorily restrain the etching thereof if an atmosphere around the upper surface of the substrate W is not replaced with an inert gas even when the pH of a rinsing liquid has been adjusted.

Figure 13:
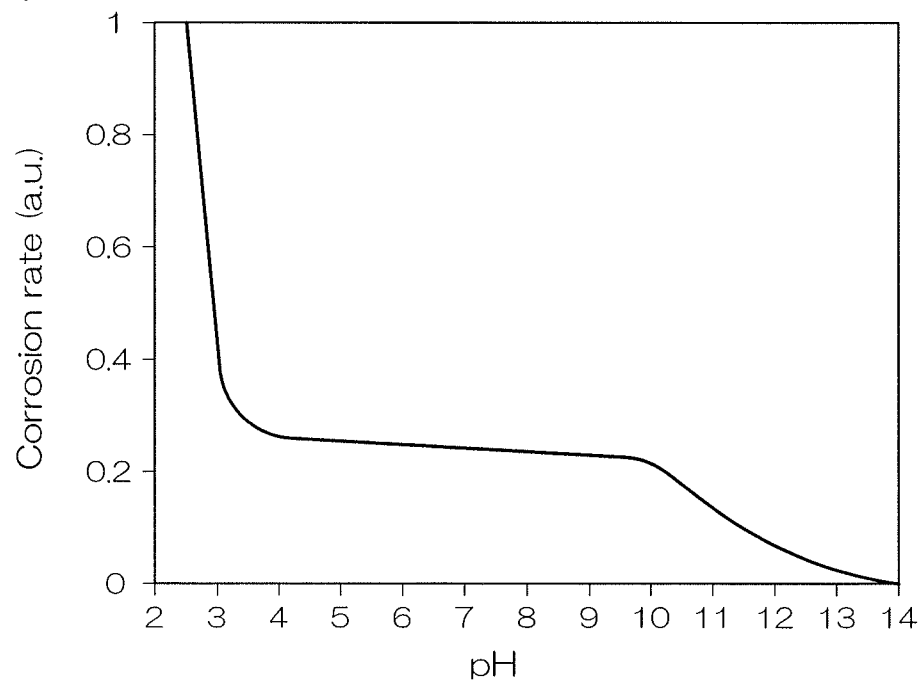
FIG. 13 is a graph showing a relationship between the pH of a rinsing liquid and the corrosion rate of a metal.

FIG. 13 is a view showing a change in the corrosion rate of a metal (which is lower in oxidation-reduction potential than hydrogen) with respect to the pH of water. If the pH of a rinsing liquid is smaller than 4, the corrosion rate of the metal becomes remarkably higher than when the pH of the rinsing liquid is 4 or more as shown in FIG. 13. The reason is that oxidation caused by hydrogen ions becomes predominant in the metal corrosion because the concentration of hydrogen ions ($H^+$) in the rinsing liquid is high. On the other hand, the corrosion rate of the metal hardly changes when the pH of the rinsing liquid is 4 or more and 10 or less. This results from the fact that the concentration of hydrogen ions in the rinsing liquid is lower than when the pH of the rinsing liquid is smaller than 4. Therefore, oxidation caused by dissolved oxygen becomes predominant in the metal corrosion when the pH of the rinsing liquid is 4 or more and 10 or less. Therefore, if the pH of the rinsing liquid is adjusted to be 4 or more and 10 or less, it will be easy to restrain the metal corrosion caused by hydrogen ions. Particularly when the pH of the rinsing liquid is adjusted by ammonia water in the same way as in the present preferred embodiment, the pH of the rinsing liquid falls within the range of greater than 7 and 10 or less, and therefore it is possible to further reduce the concentration of hydrogen ions in the rinsing liquid.

When a pre-rinsing liquid lands on the upper surface of the substrate W, friction occurs between the pre-rinsing liquid and the upper surface of the substrate W. Because of this friction, the substrate W is electrified with static electricity. In the pre-rinsing processing (S3), for example, ultrapure water is used as the pre-rinsing liquid. Ultrapure water does not contain impurities, such as ions, etc., and hence does not easily conduct electricity. Therefore, the substrate W is electrified with static electricity further easily.

Therefore, the present inventors have focused attention on the fact that the electric charge amount and the electric charge density of the upper surface of the substrate W are changed in accordance with a change in the rotational frequency of the substrate W or a change in the flow rate of a pre-rinsing liquid. When the rotational frequency of the substrate W becomes large, the electric charge amount and the electric charge density become large. On the other hand, when the rotational speed of the substrate W becomes small, the electric charge amount and the electric charge density become small. The electric charge density denotes the electric charge amount of the upper surface of the substrate W per unit area. Here, the phrase "the electric charge amount (electric charge density) becomes small" denotes that the absolute value of the electric charge amount (electric charge density) becomes small, whereas the phrase "the electric charge amount (electric charge density) becomes large" denotes that the absolute value of the electric charge amount (electric charge density) becomes large (the same applies in the following description).

The electric charge amount and the electric charge density of the upper surface of the substrate W are also changed in accordance with the flow rate of a pre-rinsing liquid supplied to the front surface of the substrate W. When the flow rate of the pre-rinsing liquid becomes large, the electric charge amount and the electric charge density become large. When the flow rate of the pre-rinsing liquid becomes small, the electric charge amount and the electric charge density become small.

Figure 14A:
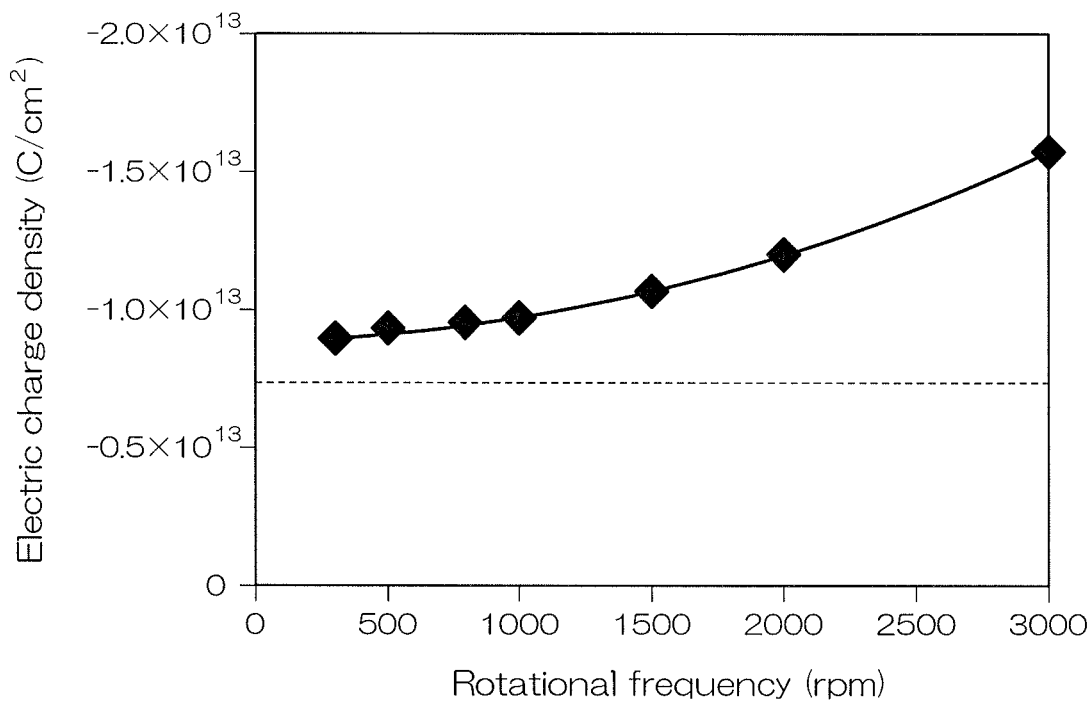
FIG. 14A is a graph showing a result obtained by measuring a change in electric charge density of the upper surface of a substrate that is caused by the rotational speed of the substrate in pre-rinsing.

First, an experiment to examine the degree of a change in electric charge density resulting from a change in rotational speed was performed. FIG. 14A is a graph showing a result obtained by measuring a change in electric charge density of the upper surface of the substrate W resulting from a change in rotational speed of the substrate W in the pre-rinsing processing (S3). In this experiment, ultrapure water was used as the pre-rinsing liquid. In this experiment, the flow rate of the ultrapure water was set at 2.0 L/min.

As shown in FIG. 14A, when the rotational frequency of the substrate W becomes small, the electric charge density becomes small. The degree of a decrease in electric charge density becomes smaller in proportion to a decrease in rotational frequency of the substrate W. In an area in which the rotational frequency is 1000 rpm or less, the degree of a decrease in electric charge density becomes even smaller than in an area in which the rotational frequency is larger than 1000 rpm. In other words, in an area in which the rotational frequency is 1000 rpm or less, the electric charge density becomes stable. In an area in which the rotational frequency is 500 rpm or less, the electric charge density becomes substantially constant regardless of a change in rotational frequency. In other words, in an area in which the rotational frequency is 500 rpm or less, the electric charge density becomes even more stable. In this experiment, the electric charge density when ultrapure water was used as the pre-rinsing liquid never became smaller than the electric charge density when carbonated water was used as the pre-rinsing liquid (see the broken line of FIG. 14A).

Figure 14B:
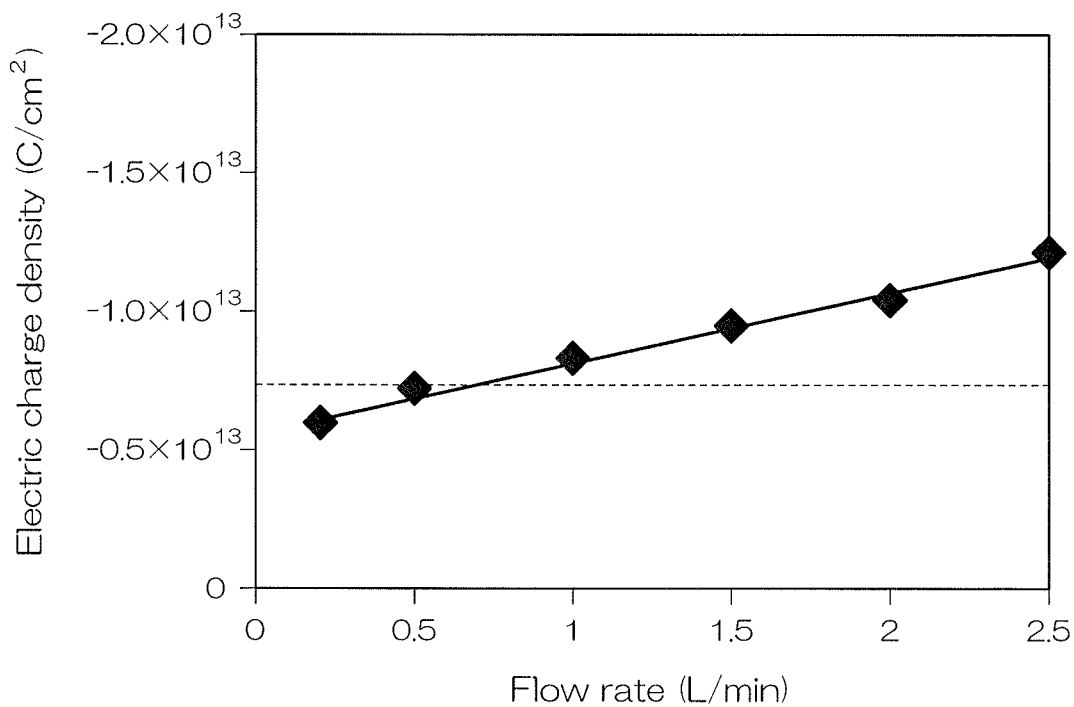
FIG. 14B is a graph showing a result obtained by measuring a change in electric charge density of the upper surface of a substrate that is caused by a change in flow rate of a pre-rinsing liquid.

Next, an experiment to examine the degree of a change in electric charge density resulting from a change in flow rate of the pre-rinsing liquid was performed. FIG. 14B is a graph showing a result obtained by measuring a change in electric charge density of the upper surface of the substrate W resulting from a change in flow rate of the pre-rinsing liquid. In this experiment, the rotational frequency of the substrate W was set at 500 rpm.

When the flow rate of the ultrapure water becomes small, the electric charge density becomes small as shown in FIG. 14B. When the rotational frequency of the substrate W was 500 rpm, the electric charge density of the upper surface of the substrate W when the flow rate of the ultrapure water was 0.5 L/min or less became smaller than the electric charge density of the upper surface of the substrate W when the carbonated water was used as the pre-rinsing liquid (see the broken line of FIG. 14B).

From the aforementioned result, it is inferred that it will be possible to sufficiently reduce the electric charge density of the upper surface of the substrate W if the rotational frequency of the substrate W is 1000 rpm or less. Particularly if the rotational frequency of the substrate W is 500 rpm or less, it is inferred that it will be possible to more sufficiently reduce the electric charge density of the upper surface of the substrate W. The rotational speed of the substrate W is 1000 rpm or less in the aforementioned preferred embodiment, and therefore it is possible to sufficiently reduce the electric charge amount of the upper surface of the substrate W.

Additionally, it is inferred that it will be possible to sufficiently reduce the electric charge density if the flow rate of the pre-rinsing liquid is 0.5 L/min or less. It is inferred that, if the rotational speed of the substrate W is 500 rpm or less and if the flow rate of the pre-rinsing liquid is 0.5 L/min or less, it will be possible to make the electric charge density lower than the electric charge density of the upper surface of the substrate W when carbonated water is used as the pre-rinsing liquid.

In the rinsing processing (S4) of the present preferred embodiment, the pH of the rinsing liquid is adjusted by ammonia water. Therefore, the rinsing liquid whose pH has been adjusted is a conductive liquid. Therefore, it is possible to restrain the electric charge of the upper surface of the substrate W. The present inventors have focused attention on the fact that the electric charge amount of the upper surface of the substrate W changes depending on the concentration of ammonia water mixed with the rinsing liquid.

When the ammonia concentration in the rinsing liquid becomes high, the electric conductivity of the rinsing liquid becomes large, whereas when the ammonia concentration in the rinsing liquid becomes low, the electric conductivity of the rinsing liquid becomes small. Therefore, if the rotational frequency of the substrate W increases, the ammonia concentration in the rinsing liquid necessary for the restraint of electrification becomes high, whereas if the rotational frequency of the substrate W decreases, the ammonia concentration in the rinsing liquid necessary for the restraint of electrification becomes low.

Figures 15, 16A:
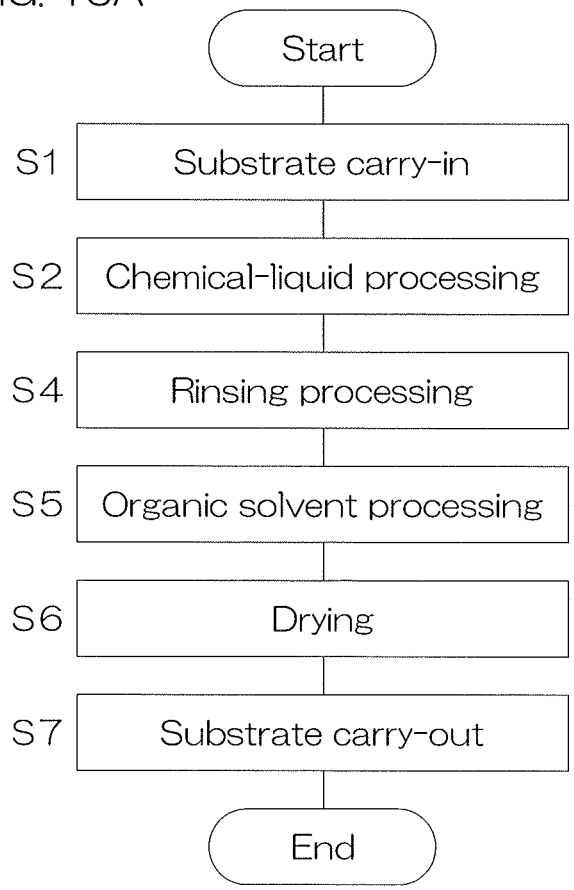
FIG. 15 is a table showing an ammonia concentration in a rinsing liquid and an electric conductivity of a rinsing liquid that are required to set the surface potential of the upper surface of a substrate that rotates at a predetermined rotational speed at 0 V.
FIG. 16A is a flowchart to describe another example of substrate processing performed by the substrate processing apparatus.

FIG. 15 is a table showing the ammonia concentration in the rinsing liquid and the electric conductivity of the rinsing liquid that are required to set the surface potential of the upper surface of the substrate W rotating at a predetermined rotational speed at 0 V.

With reference to FIG. 15, when the rotational speed of the substrate W is 1000 rpm, the ammonia concentration in the rinsing liquid is required to be 5 ppm or more in order to set the surface potential of the upper surface of the substrate W at 0 V. When the rotational speed of the substrate W is 500 rpm, the ammonia concentration in the rinsing liquid is required to be 1.5 ppm or more in order to set the surface potential of the upper surface of the substrate W at 0 V. Additionally, when the rotational speed of the substrate W is 200 rpm, the ammonia concentration in the rinsing liquid is required to be 0.5 ppm or more in order to set the surface potential of the upper surface of the substrate W at 0 V. When the rotational speed of the substrate W is 10 rpm, the ammonia concentration in the rinsing liquid is required to be 0.015 ppm or more in order to set the surface potential of the upper surface of the substrate W at 0 V.

Therefore, it is possible to, based on a measurement result (electric conductivity of the rinsing liquid whose pH has been adjusted) of the resistivity meter 15 and based on the rotational speed of the substrate W, adjust the flow rate of a pH adjustment fluid so as not to be less than an ammonia concentration necessary for prevention of static charge.

Additionally, based on a measurement result (electric conductivity of the rinsing liquid whose pH has been adjusted) of the resistivity meter 15, feedback control in which the opening degree of the pH adjustment fluid flow-rate adjusting valve 93 is adjusted by the controller 3 may be performed when the rotational speed of the substrate W is changed in the rinsing liquid supplying step. In this case, the resistivity meter 15 functions as an electric conductivity monitoring unit that monitors the electric conductivity of the rinsing liquid whose pH has been adjusted. It is possible to appropriately supply an amount of ammonia water necessary for prevention of static charge to the inside of the rinsing liquid supply pipe 81 by performing feedback control by use of the resistivity meter 15 when the rotational speed of the substrate W is changed in the rinsing liquid supplying step. Therefore, it is possible to reduce the amount of ammonia water (pH adjustment fluid) used.

According to the present preferred embodiment, when a rinsing liquid, such as water, etc., is supplied to the upper surface of the substrate W, an atmosphere around the upper surface of the substrate W is replaced with an inert gas, such as nitrogen gas, etc. Therefore, the oxygen concentration of the atmosphere around the upper surface of the substrate W is in a reduced state. Therefore, it is possible to restrain an increase in concentration of dissolved oxygen in the rinsing liquid, which is caused by the fact that oxygen is newly dissolved in the rinsing liquid existing on the substrate W. Additionally, the amount of oxygen that has been dissolved in the rinsing liquid is further reduced by allowing oxygen to move to the atmosphere around the front surface of the substrate from the rinsing liquid so as to maintain a solution equilibrium state. Therefore, metal corrosion caused by dissolved oxygen is reduced. Preferably, an inert gas is supplied to the vicinity of the upper surface of the substrate W such that the oxygen concentration of an atmosphere around the upper surface of the substrate W becomes 250 ppm or less.

Additionally, the pH of a rinsing liquid supplied to the upper surface of the substrate W is adjusted so as to form an inactive state in which a metal exposed from the upper surface of the substrate W does not react with the rinsing liquid or so as to form a passive state by allowing the metal to react with the rinsing liquid. Therefore, metal corrosion that is caused by constituents (for example, hydrogen ions) in the rinsing liquid or by dissolved oxygen in the rinsing liquid is further reduced.

As a result, in a configuration to process a substrate W having a front surface on which a metal is exposed, it is possible to restrain the corrosion of this metal.

Additionally, according to the present preferred embodiment, the pH adjustment fluid is ammonia water. Therefore, a rinsing liquid whose pH has been adjusted contains ammonia molecules serving as constituents that create complex from the upper surface of the substrate W. A rinsing liquid whose pH has been adjusted is supplied to the upper surface of the substrate W in the rinsing liquid supplying step, and the rinsing liquid on the substrate W is replaced with an organic solvent, such as IPA, etc., that is miscible with the rinsing liquid in the organic solvent replacing step subsequent to the rinsing liquid supplying step. Therefore, ions of the metal that has been slightly eluted from the upper surface of the substrate W and the pH adjustment fluid create complex ions in the rinsing liquid on the substrate W. Therefore, there is a need to restrain the occurrence of particles by replacing the rinsing liquid on the upper surface of the substrate W with a liquid differing from the rinsing liquid after the rinsing liquid supplying step.

If water is selected as a liquid with which the rinsing liquid is replaced unlike the present preferred embodiment, ammonia molecules are excluded from the upper surface of the substrate W by allowing water to be supplied onto the substrate W. Hence, metal ions and hydroxide ions existing in the water on the substrate W can easily form a metal hydroxide that is more easily deposited than the salt of complex ions.

On the other hand, if the rinsing liquid is replaced with an organic solvent that is miscible with the rinsing liquid as in the present preferred embodiment, it is possible to reduce the concentration of hydroxide ions in the liquid on the substrate W while removing complex ions. Therefore, it is possible to restrain the formation of a metal hydroxide (precipitation) while restraining the occurrence of salt deriving from complex ions. Therefore, it is possible to restrain the occurrence of particles. Additionally, it is possible to sufficiently dry the upper surface of the substrate W in a short time by drying the upper surface of the substrate W after replacing the rinsing liquid with an organic solvent.

Additionally, according to the present preferred embodiment, the hydrofluoric acid used in the chemical-liquid processing is an acidic liquid, and hence is capable of forming salt with a rinsing liquid (basic liquid) whose pH has been adjusted by ammonia water. However, the chemical liquid is washed away by a pre-rinsing liquid before the rinsing liquid is supplied to the upper surface of the substrate W. Therefore, it is possible to prevent or restrain salt formation on the substrate W by the chemical liquid and the rinsing liquid.

Additionally, the rotational speed of the substrate W in the pre-rinsing liquid supplying step is 1000 rpm or less. Therefore, it is possible to sufficiently reduce the electric charge amount of the upper surface of the substrate W. Additionally, in the pre-rinsing liquid supplying step, the pre-rinsing liquid flow-rate adjusting valve 53 is adjusted such that the amount of the pre-rinsing liquid supplied becomes a low flow rate of 0.5 L/min or less, and the electric motor 23 is controlled such that the rotational frequency of the substrate W becomes equal to or less than 200 rpm (low rotational frequency). Hence, it is possible to reduce the amount of oxygen dissolved into the pre-rinsing liquid existing on the substrate W from an atmosphere around the upper surface of the substrate W.

Additionally, according to the present preferred embodiment, a rinsing liquid that is supplied to the upper surface of the substrate W is adjusted not only in its pH but also in its oxidation-reduction potential. Therefore, it is possible to more effectively restrain the metal corrosion. Particularly, the oxidation-reduction potential of the rinsing liquid is adjusted to become, preferably, −0.5 V or more and 1.0 V or less, and the pH of the rinsing liquid is adjusted to become, preferably, 7 or more and 10 or less. If this range is satisfied, the pH and the oxidation-reduction potential are easily adjusted so that a metal exposed from the upper surface of the substrate W creates an inactive state or a passive state.

Additionally, according to the present preferred embodiment, the pH of the rinsing liquid is adjusted by allowing the ammonia water and the rinsing liquid to be mixed together after the rinsing liquid is degassed. The oxidation-reduction potential of the rinsing liquid is adjusted by allowing a mixed gas consisting of an ammonia gas and hydrogen to be mixed with the rinsing liquid after the rinsing liquid is degassed. Therefore, it is possible to remove oxygen from the rinsing liquid while preventing the gas (ammonia and hydrogen) used to adjust the pH and the oxidation-reduction potential from being removed from the rinsing liquid. In other words, it is possible to reliably adjust the pH and oxidation-reduction potential of the rinsing liquid while reducing the dissolved oxygen concentration of the rinsing liquid.

Additionally, according to the present preferred embodiment, the facing surface 7a of the blocking plate 7 that faces the substrate W from above is placed at the proximal position close to the upper surface of the substrate W between the inert gas replacing step and the rinsing liquid supplying step. Therefore, it is possible to isolate a space between the facing surface 7a and the upper surface of the substrate W from an external space. Therefore, it is possible to reliably perform the replacement of an atmosphere around the upper surface of the substrate W with an inert gas in a short time.

Even if the pH adjustment fluid is an ammonia gas, the same effect as in the present preferred embodiment is fulfilled.

The present invention can be embodied in still another mode without being limited to the aforementioned preferred embodiment.

Figure 16B:
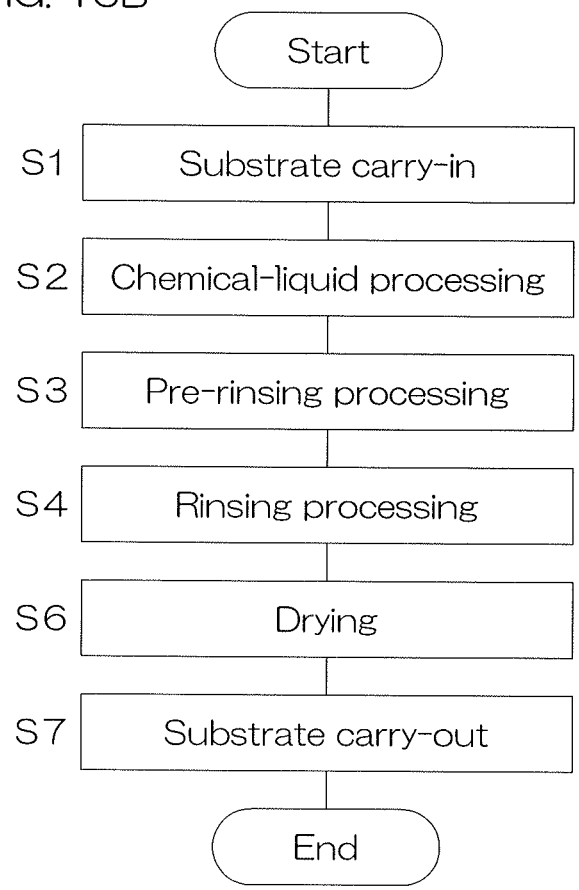
FIG. 16B is a flowchart to describe another example of substrate processing performed by the substrate processing apparatus.

For example, in the aforementioned preferred embodiment, an example where the substrate processing shown in FIG. 5 is performed was described. Unlike the aforementioned preferred embodiment, the organic solvent processing (S5) may be omitted as shown in FIG. 16B and FIG. 16C, and the pre-rinsing processing (S3) may be omitted as shown in FIG. 16A and FIG. 16C. If the pre-rinsing processing (S3) is omitted, it is preferable to use diluted hydrofluoric acid (DHF), not hydrofluoric acid (HF), in the chemical-liquid processing (S2). Its use makes it possible to restrain the formation of salt resulting from the mixture of a rinsing liquid and a chemical liquid even when the pH of the rinsing liquid used in the rinsing processing (S4) is adjusted by a basic liquid, etc., such as an ammonia water, etc.

Additionally, the performance of the pre-rinsing processing (S3) does not fulfill an effect only when hydrofluoric acid (HF) or diluted hydrofluoric acid (DHF) is used as a chemical liquid. If the chemical liquid used in the chemical-liquid processing (S2) is capable of forming salt with a rinsing liquid, the performance of the pre-rinsing (S3) makes it possible to prevent or restrain the salt formation on the substrate W by the chemical liquid and the rinsing liquid.

Additionally, the performance of the organic solvent processing (S5) does not fulfill an effect only when ammonia is contained in a pH adjustment fluid or an oxidation-reduction potential adjustment fluid. If the pH adjustment fluid or the oxidation-reduction potential adjustment fluid used in the adjusting step contains constituents that create complex ions with metal ions of a metal exposed from the front surface of the substrate W, it is possible to restrain the formation of a metal hydroxide (precipitation) while restraining the occurrence of salt deriving from the complex ions by performing the organic solvent processing (S5).

Additionally, the degassing step does not fulfill an effect only when ammonia or hydrogen is contained in the pH adjustment fluid or in the oxidation-reduction potential adjustment fluid. When a liquid in which a gas has been dissolved or a gas is contained in the pH adjustment fluid or in the oxidation-reduction potential adjustment fluid, the performance of the degassing step prior to the adjusting step makes it possible to reliably adjust the pH and oxidation-reduction potential of a rinsing liquid while preventing the gas from being removed.

Additionally, in the present preferred embodiment, the nozzles 40, 50, 60, 70, and 80 were stationary nozzles whose positions in the horizontal direction were fixed. However, unlike the present preferred embodiment, each of the nozzles 40, 50, 60, 70, and 80 may be a movable nozzle that is movable in the horizontal direction.

Additionally, in the present preferred embodiment, an atmosphere around the upper surface of the substrate W was replaced with an inert gas. However, unlike the present preferred embodiment, the entirety of an atmosphere in the chamber 18 may be replaced with an inert gas. In this case, the blocking plate 7 is not necessarily required to be provided.

Additionally, in the present preferred embodiment, the pH of a rinsing liquid was adjusted by mixing the pH adjustment fluid, the oxidation-reduction potential adjustment fluid, and the rinsing liquid together in the adjusting step. However, unlike the present preferred embodiment, only the pH adjustment fluid may be mixed with the rinsing liquid without mixing the oxidation-reduction potential adjustment fluid and the rinsing liquid together. In this case, what is required is to adjust the pH such that a metal exposed on the front surface of the substrate W creates an inactive state or a passive state. Additionally, only the oxidation-reduction potential adjustment fluid may be mixed with the rinsing liquid without mixing the pH adjustment fluid and the rinsing liquid together. In this case, what is required is to adjust an oxidation-reduction potential so that a metal exposed on the front surface of the substrate W creates an inactive state or a passive state.

In the present preferred embodiment, a configuration in which the pH adjustment fluid and the oxidation-reduction potential adjustment fluid are supplied from mutually different supply sources to the rinsing liquid supply pipe 81 was described. However, for example, when both the pH and the oxidation-reduction potential of the rinsing liquid are adjusted by ammonia water or by an ammonia gas, the adjusting unit 13 may be arranged so as to supply the ammonia water from a single supply source to the rinsing liquid supply pipe 81 through the same supply pipe.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

This application claims the benefit of priority to Japanese Patent Application No. 2017-083173 filed on Apr. 19, 2017. The entire contents of this application are hereby incorporated herein by reference.

REFERENCE SIGNS LIST

1: Substrate processing apparatus
3: Controller
7: Blocking plate
7a: Facing surface
8: Chemical liquid supply unit
9: Pre-rinsing liquid supply unit
10: Inert gas supply unit
11: Organic solvent supply unit
12: Rinsing liquid supply unit
13: Adjusting unit
20: Chuck pin (Substrate holding unit)
21: Spin base (Substrate holding unit)
84: Degassing unit
W: Substrate

The invention claimed is:

1. A substrate processing method comprising:
a substrate holding step of holding a substrate having a front surface on which a metal is exposed;
an inert gas replacing step of replacing an atmosphere around the front surface of the substrate with an inert gas by supplying an inert gas to a vicinity of the front surface of the substrate;
an adjusting step of adjusting a pH of a rinsing liquid so as to form an inactive state in which the metal does not react with the rinsing liquid or so as to form a passive state by allowing the metal to react with the rinsing liquid;
a rinsing liquid supplying step of supplying the rinsing liquid whose pH has been adjusted to the front surface of the substrate after the atmosphere around the front surface of the substrate has been replaced with the inert gas;
a chemical liquid supplying step of, before the rinsing liquid supplying step, supplying a chemical liquid that is capable of forming salt with the rinsing liquid to the front surface of the substrate;
a pre-rinsing liquid supplying step of, after the chemical liquid supplying step and before the rinsing step, washing away a chemical liquid adhering to the front surface of the substrate by supplying a pre-rinsing liquid to the front surface of the substrate, the pre-rinsing liquid being different from the rinsing liquid; and
a substrate rotating step of rotating the substrate around a rotational axis along a vertical direction in the pre-rinsing liquid supplying step,
wherein the adjusting step mixes together the rinsing liquid and a pH adjustment fluid containing a pH adjusting constituent so as to adjust a concentration of the pH adjusting constituent in the rinsing liquid thereby to adjust the pH of the rinsing liquid, and so as to adjust an electric conductivity of the rinsing liquid to be in a range of 1 µS/cm or more and 18.5 µS/cm or less,
wherein the pre-rinsing liquid supplied to the front surface of the substrate is ultrapure water,
wherein the method further comprises an electric charge reducing step of causing a flow rate of the ultrapure water in the pre-rinsing step to be in a range of 0.5 L/min or less, and causing a rotational speed of the substrate in the substrate rotating step to be in a range of 500 rpm or less, thereby to reduce an electric charge amount on the front surface of the substrate.

2. The substrate processing method according to claim 1, further comprising: an organic solvent replacing step of replacing the rinsing liquid on the front surface of the substrate with an organic solvent that is miscible with the rinsing liquid by supplying the organic solvent to the front surface of the substrate.

3. The substrate processing method according to claim 1, wherein, in the adjusting step, the pH of the rinsing liquid and an oxidation-reduction potential of the rinsing liquid are adjusted so as to form an inactive state in which the metal does not react with the rinsing liquid or so as to form a passive state by allowing the metal to react with the rinsing liquid, and
in the rinsing liquid supplying step, the rinsing liquid whose pH and whose oxidation-reduction potential have been adjusted is supplied to the front surface of the substrate.

4. The substrate processing method according to claim 3, wherein the adjusting step includes a step of adjusting the oxidation-reduction potential of the rinsing liquid by mixing the rinsing liquid and an oxidation-reduction potential adjustment fluid together.

5. The substrate processing method according to claim 4, wherein the oxidation-reduction potential adjustment fluid includes at least one from the group consisting of hypochlorous acid, periodic acid, chlorous acid, nitric acid, ammonium persulfate, hydrogen peroxide water, ammonia water, and hydrogen.

6. The substrate processing method according to claim 3, wherein, in the adjusting step, the oxidation-reduction potential of the rinsing liquid that is used in the rinsing liquid supplying step is adjusted to be in a range of −0.5 V or more and 1.0 V or less.

7. The substrate processing method according to claim 1, wherein, in the adjusting step, the pH of the rinsing liquid that is used in the rinsing liquid supplying step is adjusted to be in a range of 7 or more and 10 or less.

8. The substrate processing method according to claim 1, further comprising: a degassing step of degassing the rinsing liquid prior to the adjusting step.

9. The substrate processing method according to claim 1, wherein the substrate is horizontally held in the substrate holding step,
an inert gas is supplied to a vicinity of the upper surface of the substrate in the inert gas replacing step, and
the method further comprises a proximity step of moving a facing member that faces the substrate from above such that a facing surface of the facing member is placed at a proximal position adjacent to the upper surface of the substrate between the inert gas replacing step and the rinsing liquid supplying step.

10. The substrate processing method according to claim 1, wherein, in the inert gas replacing step, an inert gas is supplied such that an oxygen concentration in the atmosphere around the front surface of the substrate becomes 250 ppm or less.

* * * * *